United States Patent
Lin et al.

(10) Patent No.: US 10,157,922 B2
(45) Date of Patent: Dec. 18, 2018

(54) INTERCONNECT METAL LAYOUT FOR INTEGRATED CIRCUIT

(71) Applicant: TAIWAN SEMICONDUCTOR MANUFACTURING CO., LTD., Hsinchu (TW)

(72) Inventors: Wei-Cheng Lin, Taichung (TW); Kam-Tou Sio, Hsinchu County (TW); Jiann-Tyng Tzeng, Hsinchu (TW); Charles Chew-Yuen Young, Cupertino, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/457,640

(22) Filed: Mar. 13, 2017

(65) Prior Publication Data

US 2018/0151567 A1 May 31, 2018

Related U.S. Application Data

(60) Provisional application No. 62/427,073, filed on Nov. 28, 2016.

(51) Int. Cl.

| | |
|---|---|
| H01L 27/092 | (2006.01) |
| H01L 21/768 | (2006.01) |
| H01L 21/8238 | (2006.01) |
| H01L 23/522 | (2006.01) |
| H01L 23/528 | (2006.01) |
| H01L 27/02 | (2006.01) |

(52) U.S. Cl.
CPC ...... *H01L 27/092* (2013.01); *H01L 21/76897* (2013.01); *H01L 21/823814* (2013.01); *H01L 21/823871* (2013.01); *H01L 23/528* (2013.01); *H01L 23/5226* (2013.01); *H01L 27/0207* (2013.01)

(58) Field of Classification Search
CPC ............. H01L 27/092; H01L 21/76897; H01L 21/823814; H01L 21/823871; H01L 23/5226; H01L 23/528; H01L 27/0207
See application file for complete search history.

(56) References Cited

U.S. PATENT DOCUMENTS

| | | | | |
|---|---|---|---|---|
| 2007/0210391 A1* | 9/2007 | Becker | ................ | H01L 27/0207 257/390 |
| 2011/0272815 A1* | 11/2011 | Misaka | ............... | G06F 17/5072 257/773 |
| 2015/0302917 A1* | 10/2015 | Grover | .................. | G11C 11/412 365/51 |

* cited by examiner

*Primary Examiner* — Mamadou Diallo
(74) *Attorney, Agent, or Firm* — Maschoff Brennan

(57) ABSTRACT

A semiconductor device includes an active region comprising a source/drain region and a plurality of poly strips spaced apart and arranged along a first direction crossing over the active region. The first direction is substantially perpendicular to a lengthwise direction of the active region. A first metal pattern is disposed on the poly strips and arranged along the first direction. A plurality of first interconnect plugs is interposed in between the poly strips and the first metal pattern and in between the active region and the first metal pattern. A position of the first interconnect plugs being variable along the first direction.

20 Claims, 24 Drawing Sheets

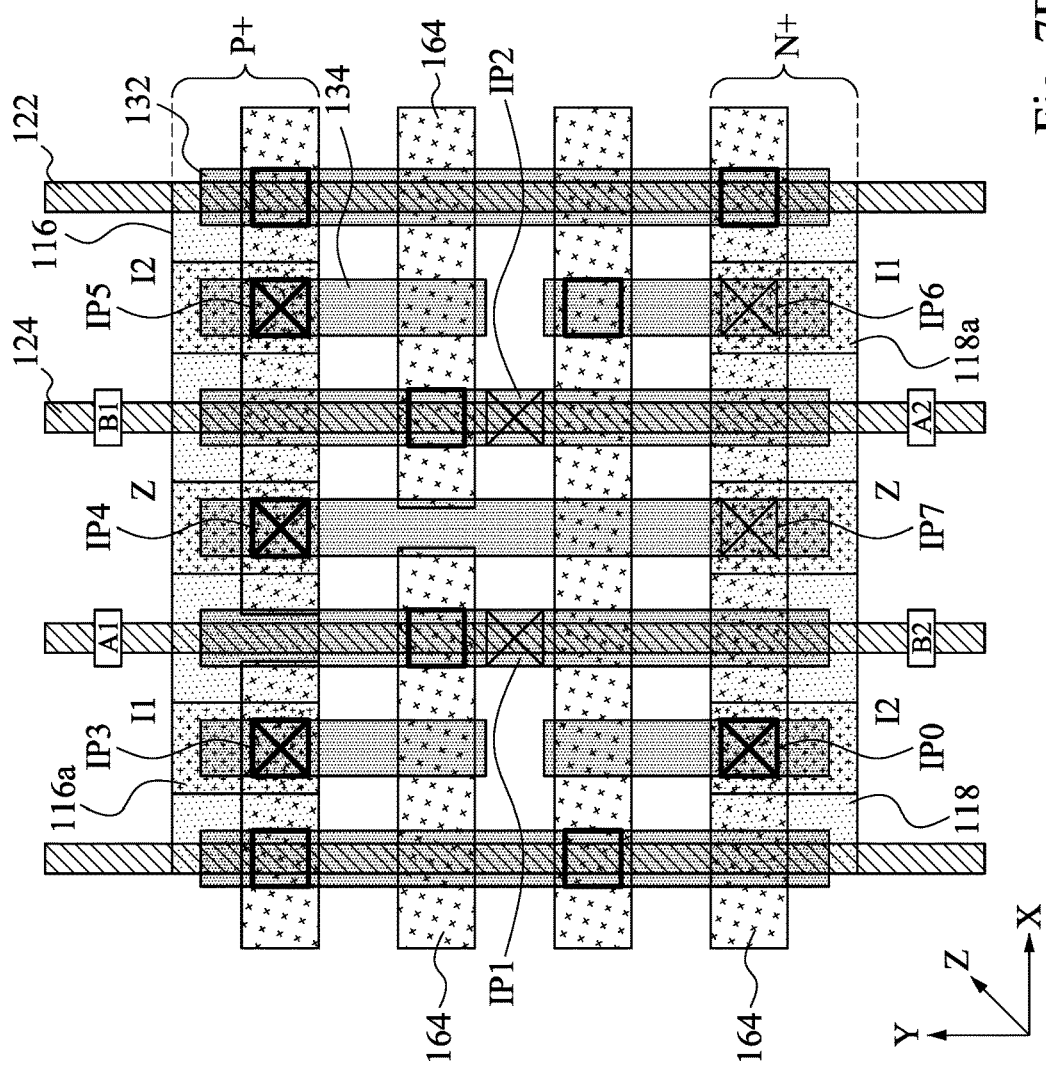
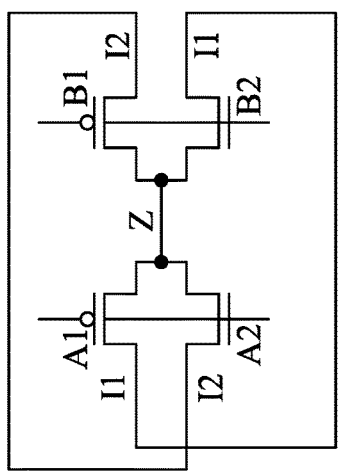
Fig. 7B
Fig. 7A

INTERCONNECT METAL LAYOUT FOR INTEGRATED CIRCUIT

This application claims priority to U.S. Provisional Application Ser. No. 62/427,073, filed Nov. 28, 2016, which is herein incorporated by reference.

BACKGROUND

Reductions in the size and inherent features of semiconductor devices, for example, metal-oxide semiconductor (MOS) devices, have enabled continued improvements in speed, performance, density, and cost per unit function of integrated circuits over the past few decades. In accordance with a design of the MOS device and one of the inherent characteristics thereof, modulating the length of a channel region underlying a gate between a source and a drain of a MOS device alters a resistance associated with the channel region, thereby affecting the performance of the MOS device. More specifically, shortening the length of the channel region reduces a source-to-drain resistance of the MOS device, which, assuming other parameters are maintained relatively constant, may allow for an increase in current flow between the source and drain when a sufficient voltage is applied to the gate of the MOS device.

To further enhance the performance of MOS devices, stresses may be introduced in the channel region of a MOS device to improve its carrier mobility, which in turn causes the improvement in saturation current, and hence the speed. It is desirable to rearrange interconnect metal scheme and allow higher device density.

However, interconnection between metal layers can be troublesome. In order to build connection between two metal layers in different levels, the arrangement of interconnect plugs may result in expanding in cell boundary. When cell boundary pushes outwardly, it also implies a smaller spacing between neighbouring components. The area of spare processing window reduces as the cell boundary enlarges, and subsequent manufacturing process may encounter spatial restriction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7A is a schematic circuit in accordance with some embodiments of the instant disclosure;

FIG. 7B is a schematic layout of the circuit shown in FIG. 7A in plan view;

DETAILED DESCRIPTION

Figure 1:
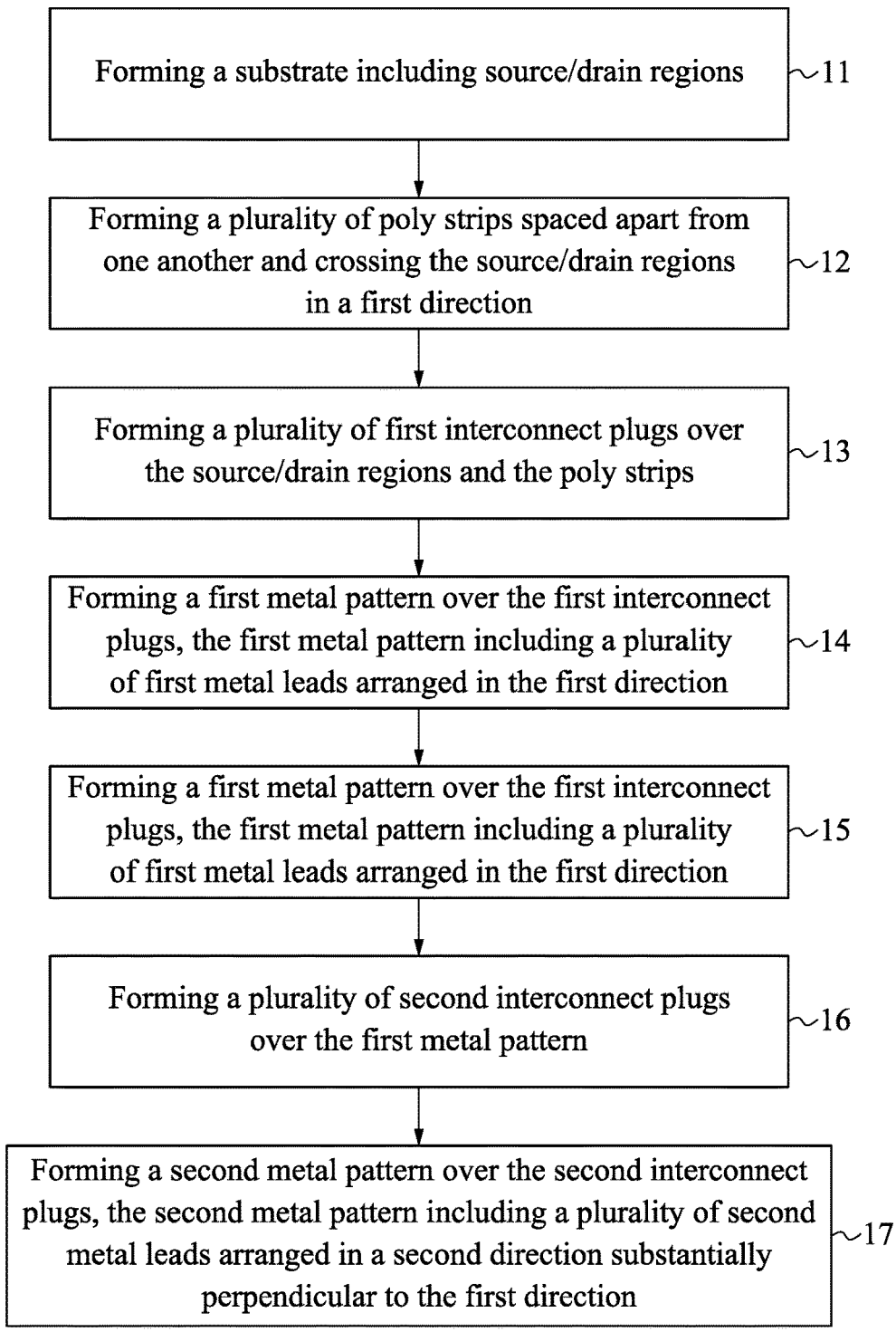
FIG. 1 is a flow chart illustrating a method of fabricating a semiconductor device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An interconnect metal layout for increasing process window and reducing resistance capacitance is presented. The embodiments and the variations of the embodiments are discussed. Throughout the various views and illustrative embodiments of the instant disclosure, like elements are designated with the same or like reference numbers for ease of understanding.

Reference is made to FIG. 1. FIG. 1 depicts a flow chart of a method 10 of fabricating a semiconductor device in accordance with some embodiments of the instant disclosure. The method begins with operation 11 in which a substrate including source/drain regions is formed. The method continues with operation 12 in which a plurality of poly strips is spaced apart from one another and crossing the source/drain regions in a first direction. Subsequently, operation 13 is performed. A plurality of first interconnect plugs are formed over the source/drain regions and the poly strips. The method continues with operation 14 in which a first metal pattern is formed over the first interconnect plugs. The first metal pattern includes a plurality of first metal leads arranged in the first direction. The method continues with operation 15 in which a plurality of second interconnect plugs is formed over the first metal pattern. Next the method continues with operation 16 in which a second metal pattern is formed over the second interconnect plugs. The second metal pattern including a plurality of second metal leads arranged in a second direction substantially perpendicular to the first direction.

Figure 2A:
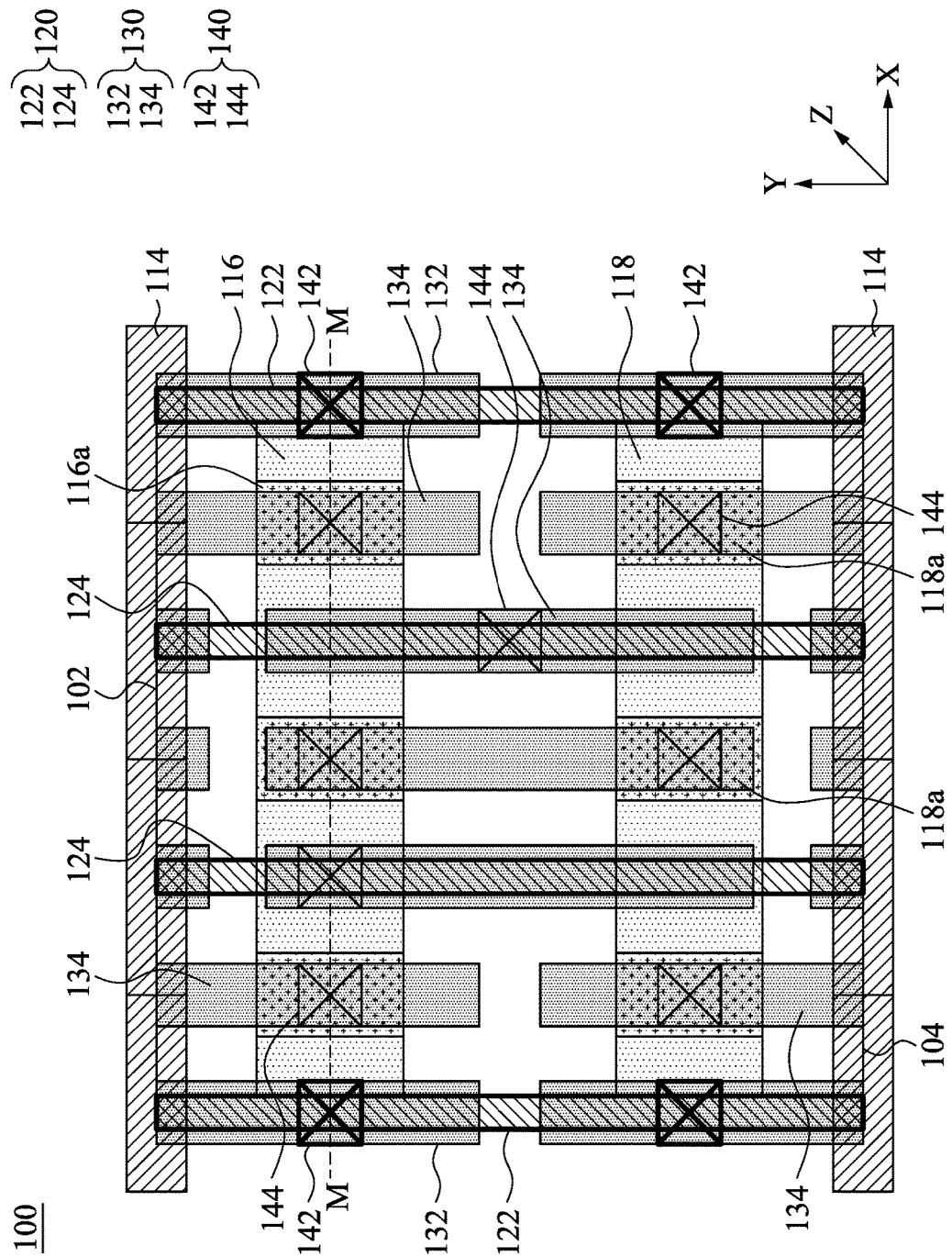
FIG. 2A is a schematic plan view of a semiconductor device in accordance with some embodiments of the instant disclosure.

Please refer to FIG. 2A. A portion of standard cell 100, which has a device region (e.g., logic function), is provided. The term device region as used herein refers to a region of the substrate associated with a MOS device having a particular type of channel. The channel type, n-type or p-type, of a channel is identified based on the conductivity type of the channel developed under the transverse electric field. This means that an NMOS device region, for example, includes an n-type channel under a transverse electric field and is associated with n-type doped active regions and gate electrodes. The illustrated standard cell 100 includes PMOS device and NMOS device operating together as, for example, an inverter. The upper boundary 102 and the lower boundary 104 of standard cell 100 are marked using solid lines. The standard cell 100 includes a semiconductor substrate that active regions 116 and 118 (source/drain regions) are formed thereon.

A plurality of poly strips 120 is spaced apart from each other and extending along a first direction on a substrate (not shown in FIG. 2A). For the sake of clarity, the first direction is designated as a direction along the Y-direction shown in FIG. 2A. The poly strips 120 include a pair of dummy poly strips 122 and poly strips 124. For illustration in FIG. 2A, the dummy poly strips 122 are arranged at the right side and the left side of the standard cell 100, and the poly strips 124 are arranged in between the dummy poly strips 124. The poly strips 120 are arranged substantially parallel to each other. In some embodiments, the dummy poly strips 122 and the poly strips 124 are formed of polysilicon. Accordingly, the term "poly strip" discussed in the present disclosure is also referred to as "PO" in some embodiments. Various conductive materials used to form the dummy poly strips 122 and the poly strips 124 are within the contemplated scope of the present disclosure. For example, in various embodiments, the dummy poly strips 122 and the poly strips 124 are formed of metals, metal alloys, metal silicides, or the like.

In some embodiments, the poly strips 124 are formed as gates of MOS devices. In some embodiments, a PMOS device includes an active region 116 and a portion of poly strip 124 overlying the active region 116. An NMOS device includes an active region 118 and a portion of poly strip 124 overlying active region 118. Portions of the semiconductor substrate which lie adjacent to the poly strips 124 generally define the active regions 116 and 118 of the substrate. As used herein, the term active region encompasses a region where an active portion of the device resides whether the active portion has been or will be formed. The active regions 116 and 118 may serve, for example, as source or drain regions of a semiconductor device. In some embodiments, the portions of the active region 116, at opposite sides of the respective poly strip 124, are each formed as a source/drain region 116a of PMOS device. In some embodiments, the portions of the active region 118, at opposite sides of the respective poly strip 124, are each formed as a source/drain region 118a of NMOS device. Explained in a different way, the active region 116 is a p-type region and the active region 118 is an n-type region in some embodiments.

In some embodiments, the dummy poly strips 122 are each arranged as a dummy gate in MOS devices. The dummy gate does not act as a gate to any transistor.

Reference is still made to FIG. 2A. First interconnect plugs 140 are formed over the poly strips 120 and the active regions 116 and 118. The first interconnect plugs 140 are conductive members that allows electrical connection between the active regions 116 and 118 and the subsequently formed first metal pattern. For simplicity of illustration, only a few reference numbers designating the first interconnect border plugs 140 (including 142 and 144) are shown in FIG. 2A.

First metal pattern is formed over the first interconnect plugs 140. The first metal pattern is an electrically conductive metal layer includes first metal leads 130 that are disposed over the poly strips 120 and extend along the Y-direction (first direction), which is the direction the poly strips 120 follows. The first metal leads 130 include first metal border leads 132 disposed over the dummy poly strips 122, respectively. For illustration in FIG. 2A, over each dummy poly strip 122 are two first metal border leads 132 aligned with the underlying dummy poly strip 122. The number of the first metal border leads 132 is at least two, corresponding to the number of dummy poly strips 122. In some embodiments, the number of the first metal border leads 132 is three or more. As shown in FIG. 2A, there are four first metal border leads 132. For simplicity of illustration, only one reference number designating the first metal border leads 132 is shown in FIG. 2A.

In some embodiments, the first metal leads 130 further include first metal cell leads 134 that are disposed over the active regions 116, 118 and poly strips 124. For simplicity of illustration, only a few reference numbers designating the first metal cell leads 134 is shown in FIG. 2A. The number and the arrangement of the first metal leads 130 as discussed above are given for illustrative purposes. The number and the arrangement of the first metal leads 130 may vary according to circuit layout design. Various numbers and arrangements of the first metal leads 130 are within the contemplated scope of the present disclosure.

Reference is still made to FIG. 2A. The first interconnect plugs 140 are arranged in between the poly strips 120 and the first metal pattern and electrically connecting the source and drain regions of the respective MOS devices to the overlying first metal pattern. More specifically, the first interconnect plugs 140 include first interconnect border plugs 142 and first interconnect cell plugs 144. The first interconnect border plugs 142 are interposed in between the dummy poly strips 122 and the first metal border leads 132. Some of the first interconnect cell plugs 144 are interposed in between the source/drain regions 116a, 118a and the first metal cell leads 134. These first interconnect cell plugs 144 serve to electrically connect the source/drain regions 116a, 118a and the first metal cell leads 134. Some of the first interconnect cell plugs 144 are interposed in between the poly strips 124 and the first metal leads 134. These first interconnect cell plugs 144 serve to electrically connect the gate electrode strip (poly strips 124) and the overlying first metal cell leads 134.

In some embodiments, positions of the first interconnect plugs 140 are variable. In other words, a position of the first interconnect plug 140 may vary along the first direction. The first interconnect plugs 140 may not be aligned to one another but in a zigzag manner. The positions of the first interconnect plugs 140 depend on where an electrical connection should be established. The arrangement of the first interconnect plugs 140 is elaborated herein. The orientations of the poly strips 120 and the first metal leads 130 are the same, and the poly strips 120 are underlying the first metal leads 130. This arrangement allows large overlapping area between the poly strips 120 and the first metal leads 130. The first interconnect plugs 140 that serve to electrically connect the poly strips 120 and the first metal leads 130 is able to be positioned along this overlapping area for electrical connection. More specifically, the first metal cell lead 134 is disposed over the poly strip 124, and the first interconnect cell plug 144 may be disposed on any place, along the Y-direction, where the poly strip 124 and the first metal cell lead 134 overlap one another or where the source/drain regions 116a, 118a and the first metal cell lead 134 overlap. The positions of the first interconnect plugs 140 can be relatively arbitrary because the poly strips 120 and the first metal leads 130 are aligned along the same direction (e.g., Y-direction). Explained in a different way, the first interconnect plugs 140 have the entire first metal leads 130 as the connection node.

Cut lines 114 are formed at the upper boundary 102 and lower boundary 104 of standard cell 100. Cut lines 114 extends along a second direction, shown as the X-direction in FIG. 2A. In some embodiments, the cut lines 114 are implemented in a poly cut layer (also referred to as "CPO" in some embodiments). In alternative embodiments, the cut lines 114 are not formed and are not required. The first direction (e.g., Y-direction) and the second direction (e.g., X-direction) are substantially perpendicular in a planar view.

Figure 2B:
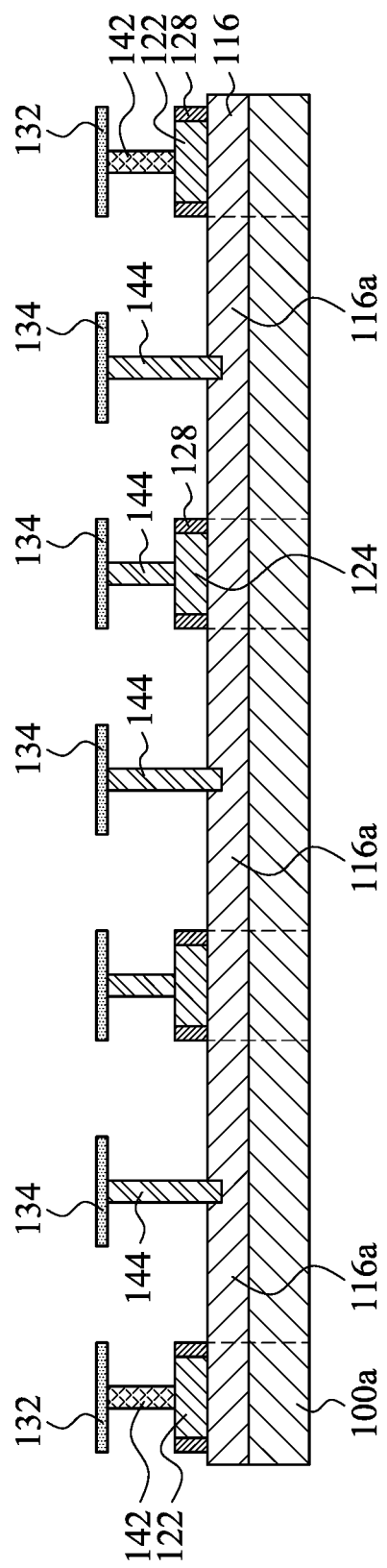
FIG. 2B is a cross-sectional view of a portion of a semiconductor device in accordance with some embodiments of the instant disclosure.

Reference is made to FIG. 2B, illustrating a simplified cross-sectional view of the standard cell 100 along M-M in FIG. 2A. The source/drain regions 116a are formed on the semiconductor substrate 100a. Spacers 128 may be formed on either side of the poly strips 120. The device poly strips 124 are arranged in between the pair of dummy poly strips 122. The first interconnect boarder plugs 142 are disposed on the pair of dummy poly strips 122. The first metal boarder leads 132 are disposed on the first interconnect boarder plugs 142, over lapping the dummy poly strips 122. Within the device cell boundary, the first interconnect cell plugs 144 interpose in between the device poly strips 124 and the first metal cell leads 134. In addition, the first interconnect cell plugs 144 interpose in between the source/drain regions 116a and the first metal cell leads 134.

Figure 2C:
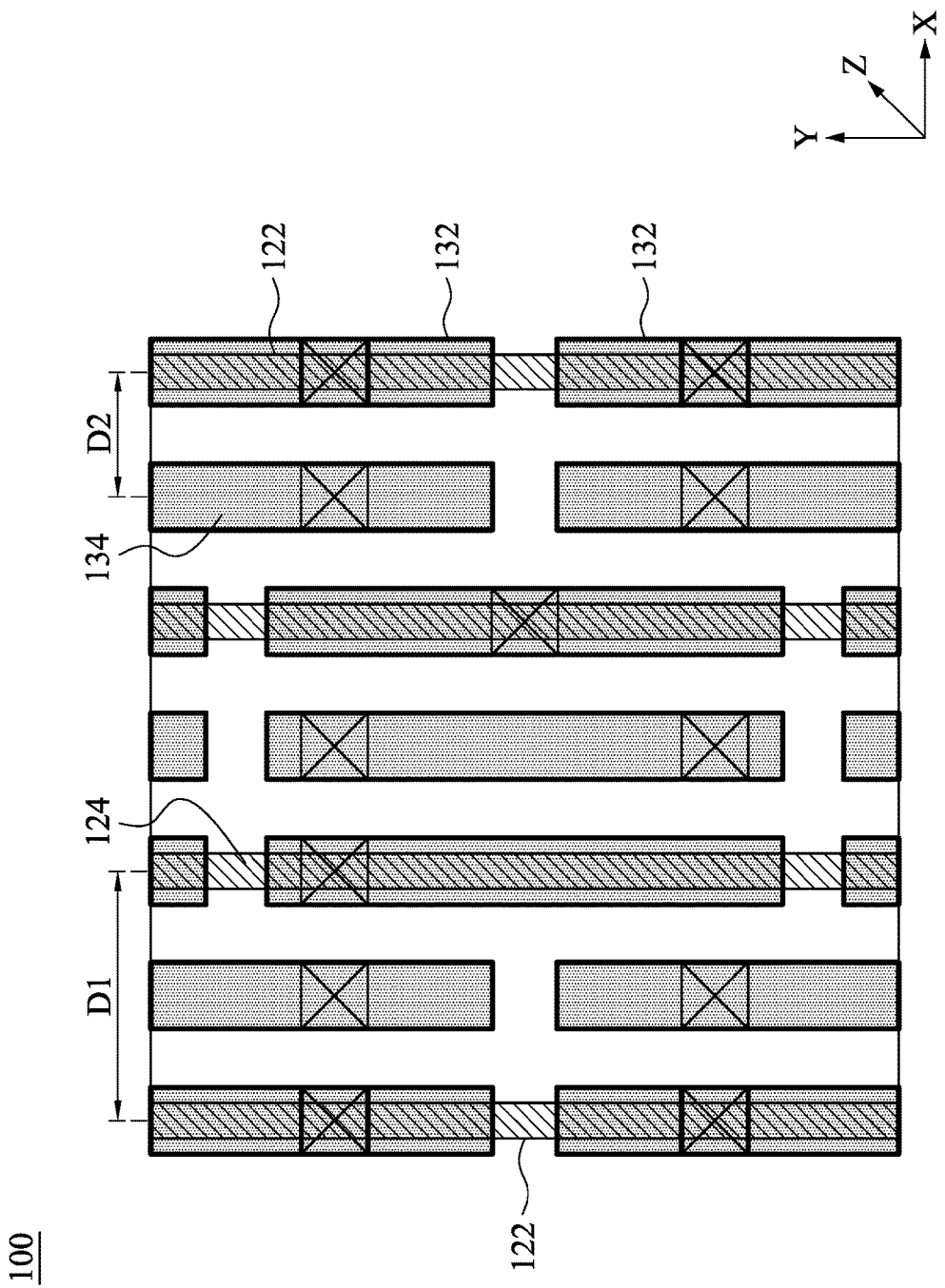
FIG. 2C is a schematic plan view of a simplified interconnect metal scheme for a semiconductor device in accordance with some embodiments of the instant disclosure.

Attention is now invited to FIG. 2C, illustrating a simplified standard cell 100. Any two immediately adjacent poly strips 120 have a poly pitch D1 along the second direction (X-direction). Poly pitch D1 is measured from one poly strip to another that is right next to it in the X-direction. Any two immediately adjacent first metal leads 130 have a first metal pitch D2. In some embodiments, the poly pitch D1 is substantially twice the first metal pitch D2. That is, the first metal pitch D2 is narrower than the poly pitch D1, such that the first metal leads 130 are arranged in a denser fashion in comparison with the poly strips 120. For illustration, the poly strip 120 spans double the first metal pitch D2 to reach their neighbouring poly strip 120. For example, dummy poly strip 122 has a poly pitch D1 between its neighbouring poly strip 124. The poly pitch D1 is equivalent to two first metal pitch D2, and therefore three columns of first metal leads 130 can be arranged within the same area.

Figure 2D:
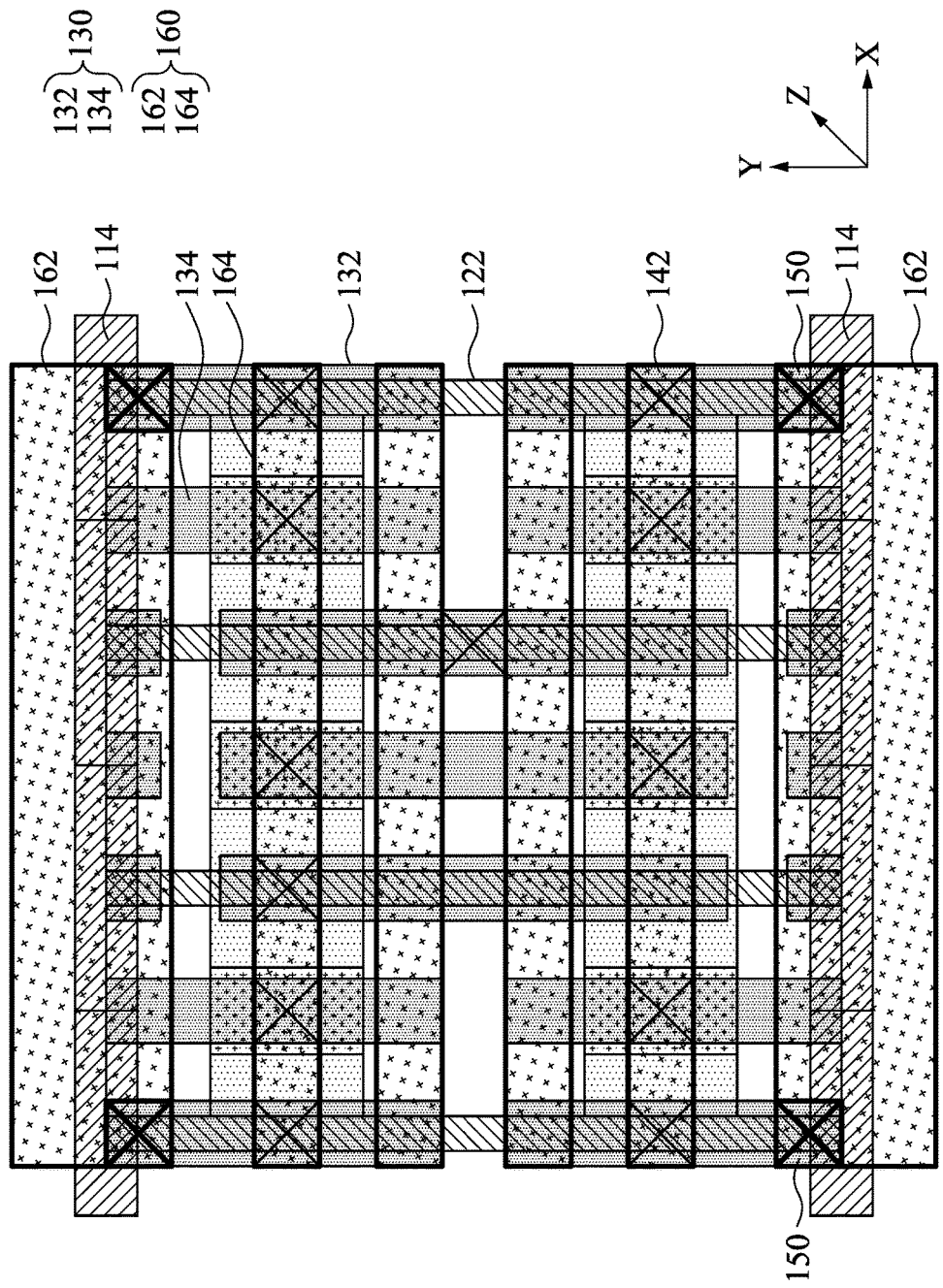
FIG. 2D is a schematic plan view of a simplified interconnect metal scheme for a semiconductor device in accordance with some embodiments of the instant disclosure.

Attention is now invited to FIG. 2D, illustrating second metal leads 160 disposed over the first metal leads 130 and extending along the second direction (X-direction). The second metal leads 160 include a pair of power rails 162 and second metal layer cell leads 164. For simplicity of illustration, only one reference number designating the second metal layer cell leads 164 are shown in FIG. 2D.

The pair of power rails 162 overlaps the poly strips 120 and first metal leads 130. As shown in FIG. 2D, the power rails 162 have a coverage spanning on the cut line 114. A portion of the power rail 162 is inside the device cell boundary, and a portion of the power rail 162 is outside the device cell boundary. Power rail 162 is arranged in the X-direction and is superimposed on portions of the poly strips 120 and the first metal leads 130 that are close to the device cell boundary. The second metal layer cell leads 164 are arranged in between the pair of power rails 162 and perpendicular to the underlying first metal leads 130 in a planar view. The second metal leads 160 are spaced apart from and parallel to each other. According to the planar view of standard cell 100, the poly strips 120 and the first metal leads 130 are arranged along the Y-direction, while the second metal leads 160 are arranged along the X-direction, and therefore an interlaced pattern is created.

The second interconnect plugs 150 are interposed in between the first metal leads 130 and the second metal leads 160. Due to arrangements of the first metal leads 130 being perpendicular to the second metal leads 160 in a planar view, the first metal leads 130 and the second metal leads 160 overlap at certain intersections. The second interconnect plugs 150 are configured to be disposed at these overlapped intersections. The freedom of movement, which allows the first interconnect plugs 140 arranged along the Y-direction, is not available to the second interconnect plugs 150.

Figure 3:
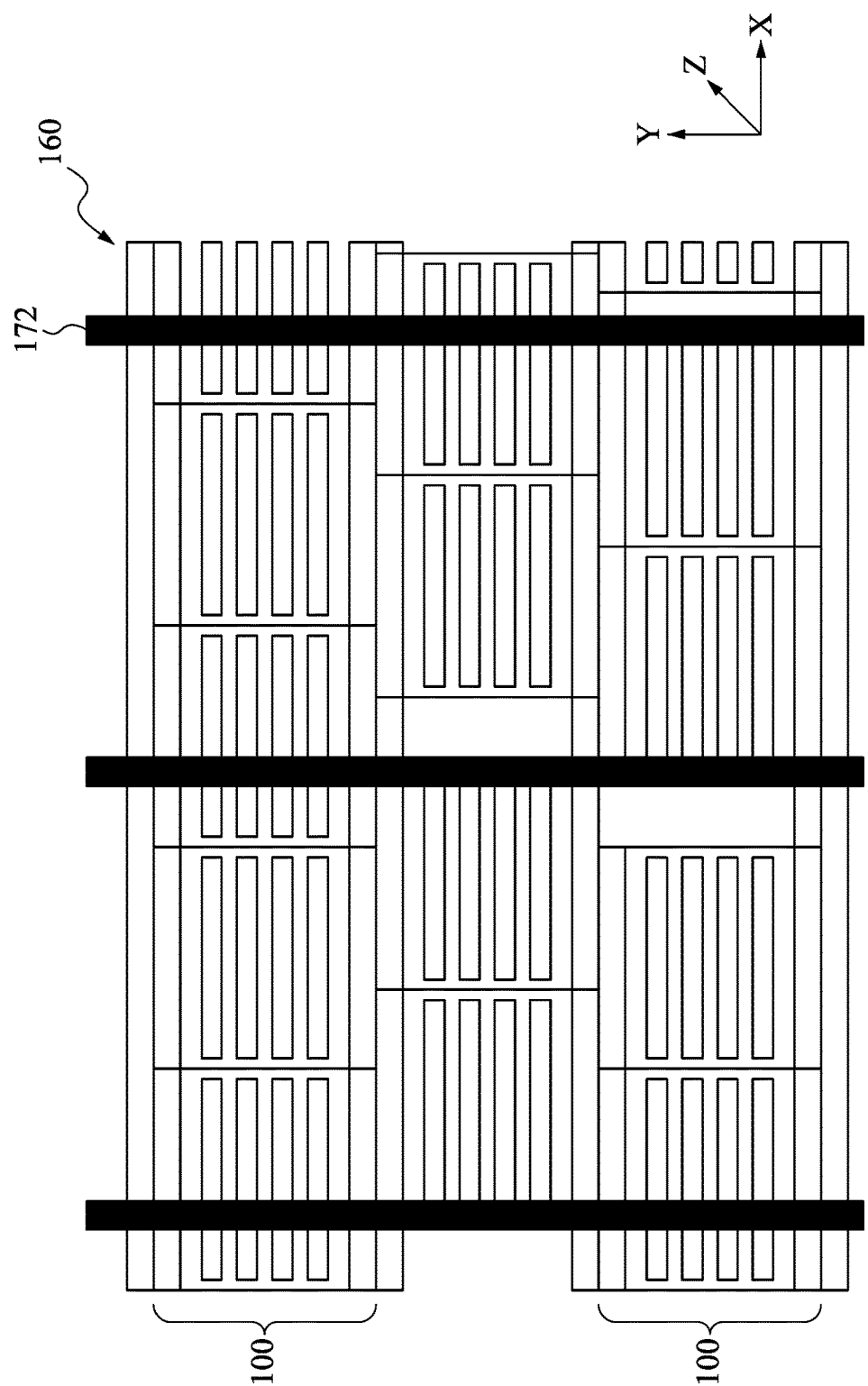
FIG. 3 is a schematic plan view of an interconnect metal scheme for a semiconductor device in accordance with some embodiments of the instant disclosure.

Attention is now invited to FIG. 3, illustrating a plurality of power straps 172, disposed over the second metal leads 160, in the first direction (Y-direction). The power straps 172 are disposed in the third level that is above the first metal and the second metal layer. In some approaches, power straps and cell input/output (I/O) pins are disposed on the same level, and the power straps and the cell I/O pins cannot overlap each other. Accordingly, cell placement forbidden zone where the power straps are placed is then created. The cell placement forbidden zone compromises the area where the cell I/O pins are placed, thus resulting in smaller chip area.

Compared to the above approaches, as discussed above in the present disclosure, the power straps 172 are disposed above the first metal and the second metal layer. For illustration, when the power straps 172 are disposed in one metal layer, the cell I/O pins are disposed on a lower level different from the power straps 172, and the area where the cell I/O pins are placed is not interrupted. The cell placement forbidden zone is therefore eliminated in this arrangement.

Figure 4A:
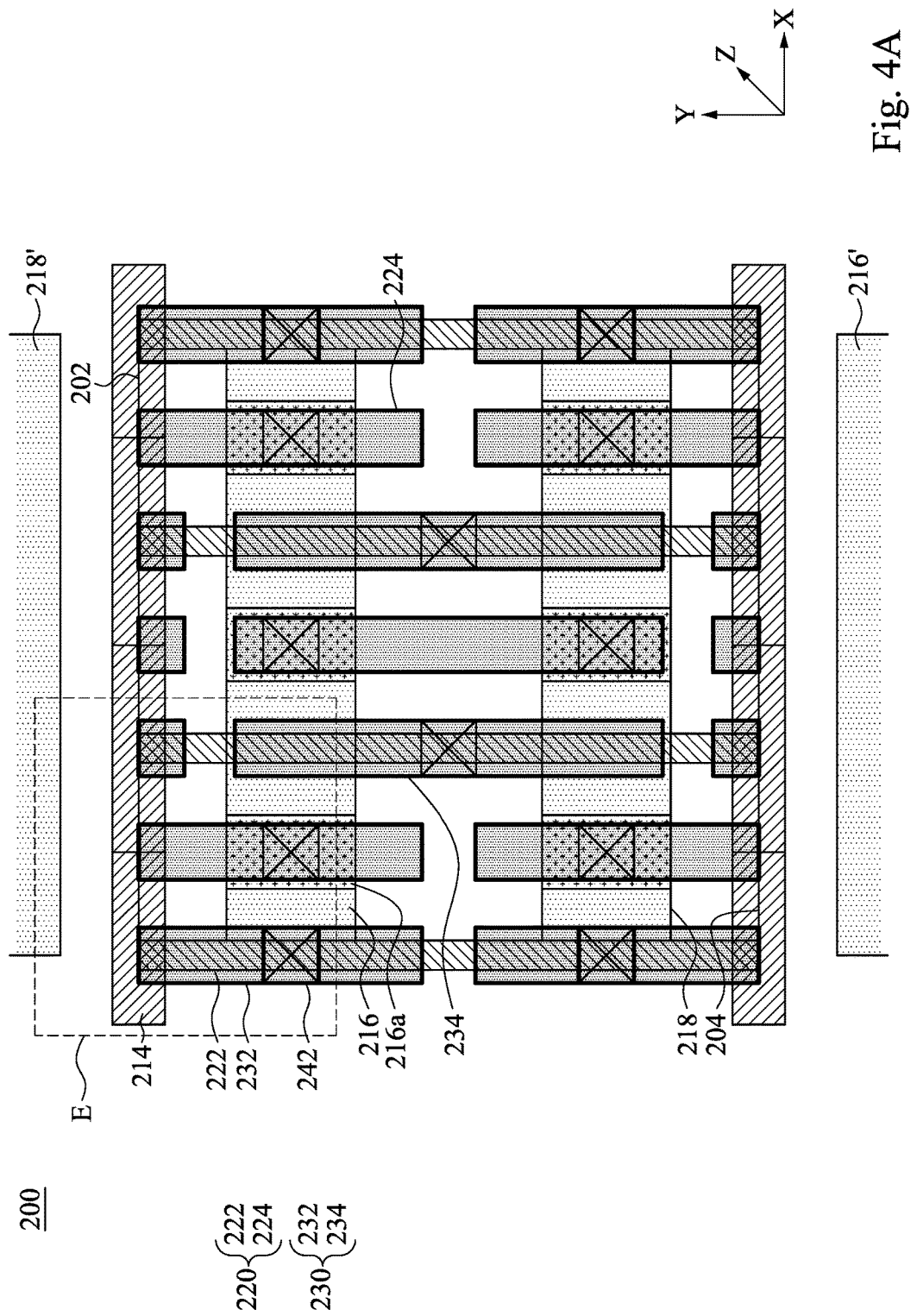
FIG. 4A is a schematic plan view of an interconnect metal scheme for an integrated circuit in accordance with some embodiments of the instant disclosure.

Attention is now invited to FIG. 4A, illustrating a standard cell 200 having interconnect metal scheme for an integrated circuit in accordance with some embodiments of the instant disclosure.

Standard cell 200 is similar to the cell 100, including a pair of dummy poly strips 222, poly strips 224 disposed along the Y-direction. The first metal border leads 232 overlaps the dummy poly strips 222. The first metal cell leads 234 are disposed along the Y-direction and spanning over the active regions 216, 218. The lower and upper boundaries 202, 204 are marked with solid lines, and the cut lines 214 are aligned with the lower and upper boundaries 202, 204, respectively. In FIG. 4A, an active region 218' is shown on the opposite side of the cut line 214 at the upper boundary 202. As previously discussed, standard cell 200 may be adjoined with another cell in the Y-direction. When two cells are aligned along the Y-direction next to each other, two active regions 216, 218' are placed on opposite sides with respect to the cut line 214. A fragmentary enlarged view illustrating an area E in FIG. 4A is shown in FIG. 4B.

Figure 4C:
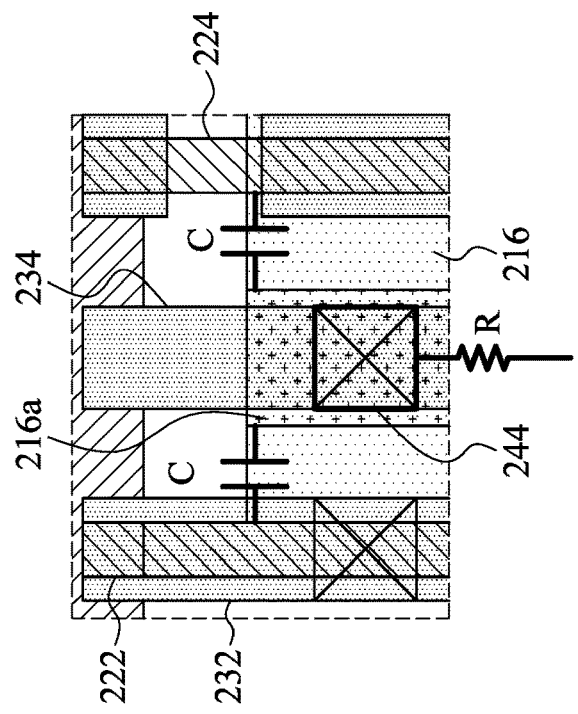
FIG. 4C is a zoom in of an area E in FIG. 4A with annotated circuitry.
Figure 4B:
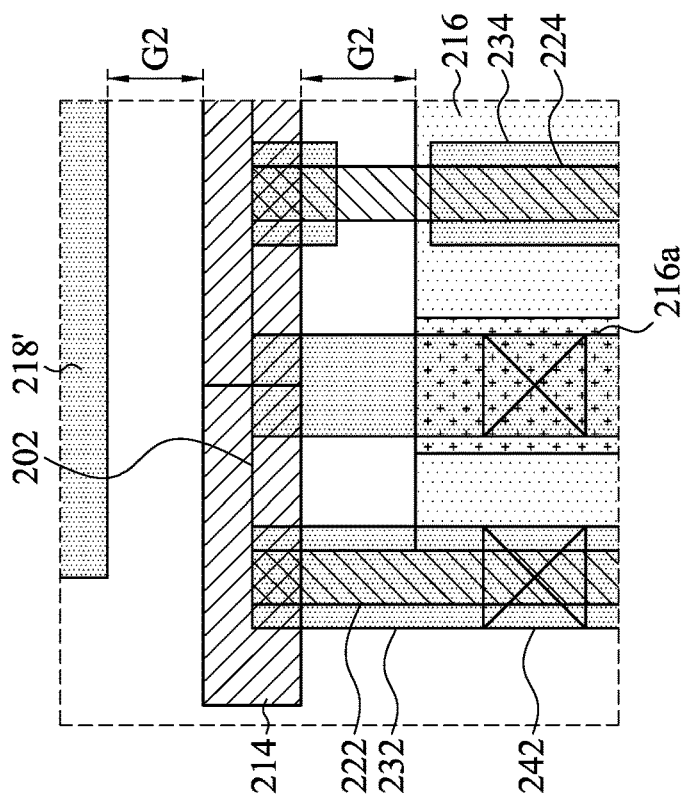
FIG. 4B is a zoom in of an area E in FIG. 4A.

Attention is now invited to FIG. 4B, illustrating the fragmentary enlarged view of the area E of the standard cell 200. The cut line 214 has a portion inside standard cell 200 and another portion outside standard cell 200. As shown in FIG. 4B, the portions of cut lines 214 outside standard cell 200 are in other standard cells abutting standard cell 200.

The space in between the active regions 216, 218' is known as the active region spacing G. Cut line 214 and active region 216 have a pre-determined gap G2. Likewise, cut line 214 and active region 218' have a pre-determined gap G2. Gap G2 is a window for fabrication processing.

In some approaches, the first metal lead is arranged over the poly strip and perpendicular to the underlying poly strip in a planar view, and an intersection of the first metal lead and the poly strip receives a first interconnect boarder plug. Very often, the first interconnect border plug is disposed at the device cell boundary because of limited options of intersections between the first metal leads and the poly strips. When the first interconnect border plug is disposed at the device cell boundary, the cut line has to yield the space to the first interconnect border plug and is offset from the device cell boundary, shifting outwardly in relation to the device cell boundary. As a result, the gap between the cut line and the active region of the abutting cell shrinks, resulting in a smaller and compressed process window. This smaller and compressed process window increases fabrication challenge.

Compared to the above approaches, for illustration in FIG. 4B, the dummy poly strips 222 and the first metal border leads 232 are arranged in the same direction, i.e., the first direction (Y-direction), and overlap one another. The first interconnect border plug 242 is disposed at any position where the dummy poly strips 222 and the first metal border leads 232 overlap. The freedom of deposition of the first interconnect boarder plugs 242 allows a larger, fixed gap G2.

In some embodiments, the cut line 214 is aligned with the device cell boundary 202 without offset because the first interconnect border plugs 242 do not compete with the cut line 214 for the active region spacing G. The cut line 214 has fixed gap G2 apart from the two active regions 216, 218' on opposite sides, and the fixed gap G2 ensures sufficient process window for following fabrication. The placement of the first interconnect plugs 240 vary along the Y-direction, while the active region spacing G is predictable and fixed in some embodiments.

Attention is now invited to FIG. 4C, illustrating an equivalent circuit at the area E in FIG. 4A of the standard cell 200. As previously discussed, the first metal leads 230 are arranged in the first direction (Y-direction), which is parallel with the poly strips 220. This arrangement advantageously results in another benefit. For illustration, the first metal cell leads 234 easily align with the underlying source/drain region 216a, which is formed in between every two immediately adjacent poly strips 220 (e.g., poly strips 222 and 224). The first interconnect cell plug 244 electrically connects the superimposing source/drain region 216a to first metal cell lead 234 as long as they are interposed in between the poly strips 220 and the first metal leads 230.

Moreover, a broader range of selection for first interconnect cell plug 244 is available in the layout design. For example, first interconnect cell plug 244 is disposed over the source/drain region 216a, and the first interconnect cell plug 244 is disposed right above the source/drain region 216a as well. In this case, coupling capacitance can be greatly reduced because the routing path between the source/drain region 216a and the first metal lead 234 is shortened due to the direct overlapping scaffolding. The reduction in coupling capacitance can improve the device operation speed.

Figure 5B:
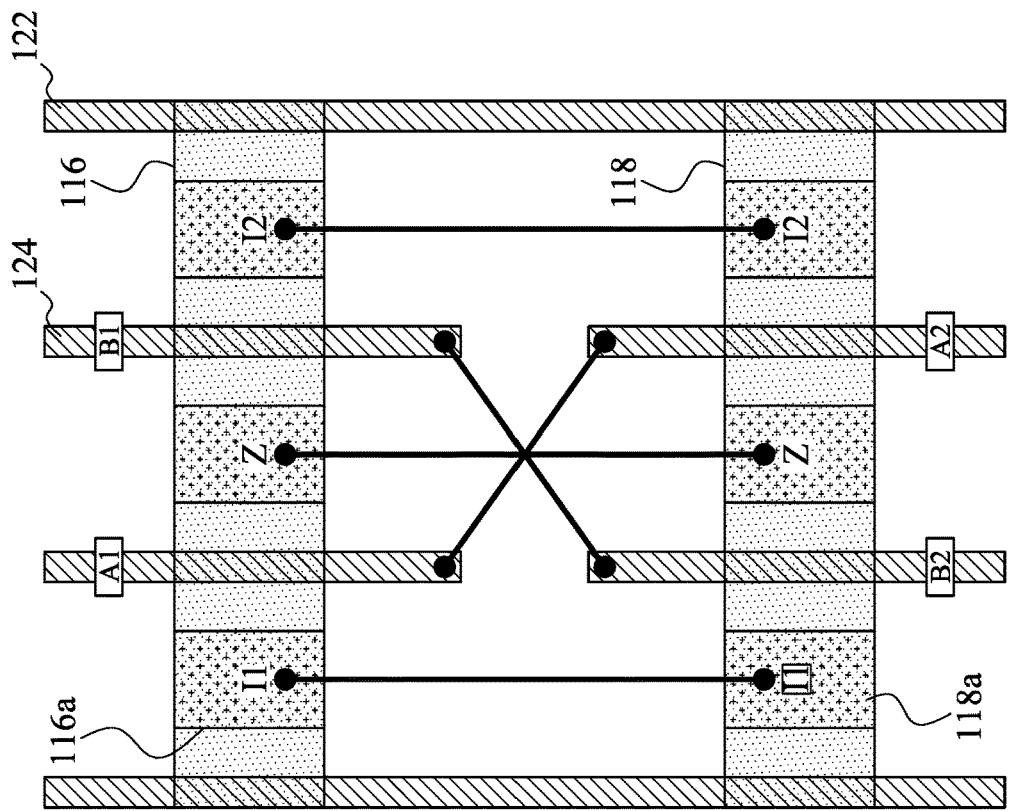
FIG. 5B is a simplified schematic layout of the circuit shown in FIG. 5A in plan view.
Figure 5A:
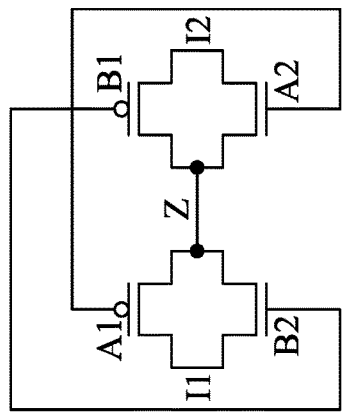
FIG. 5A is a schematic circuit in accordance with some embodiments of the instant disclosure.

Attention is now invited to FIGS. 5A and 5B using the standard cell 100 and/or 200 for the interconnect metal scheme. FIG. 5A illustrates a circuit for a transmission gate circuit, and FIG. 5B illustrates a simplified layout of the circuit in FIG. 5A. As shown in FIG. 5B, four transistors are electrically connected. In some embodiments, PMOS devices are formed with the active region 116, and NMOS devices are formed with the active region 118. For illustration, PMOS transistor A1 is electrically connected to NMOS transistor A2, and PMOS transistor B1 is electrically connected to NMOS transistor B2. The source/drain I1 of PMOS transistor A1 is electrically connected to the source/drain I1 of NMOS transistor B2. The source/drain I2 of PMOS transistor B1 is electrically connected to the source/drain I2 of NMOS transistor A2. PMOS transistors A1 and B1 and NMOS transistors A2 and B2 are electrically connected together at the connection node Z. Embodiments of various circuits and layout designs of the transmission gate circuit in FIG. 5A are further elaborated herein.

Figure 6B:
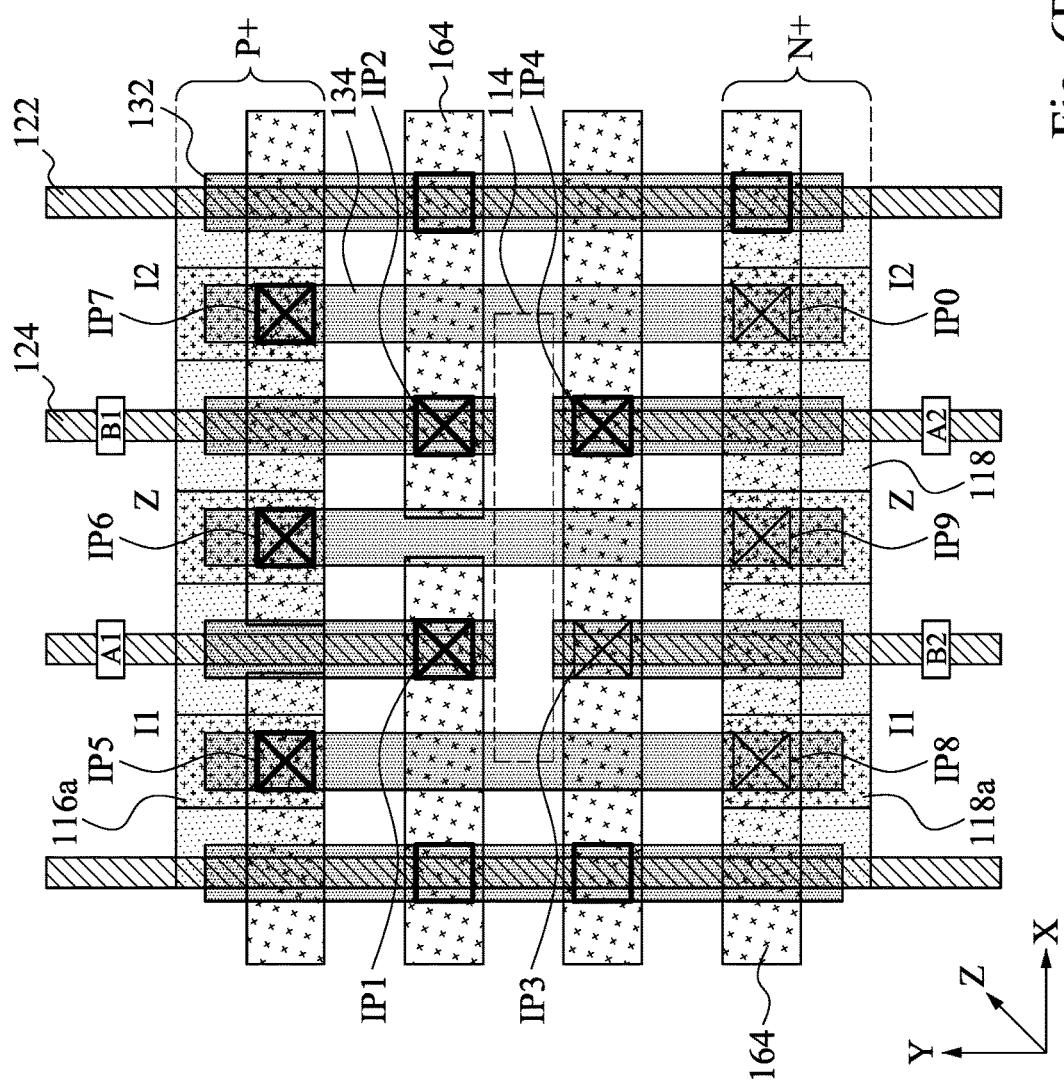
FIG. 6B is a schematic layout of the circuit shown in FIG. 6A in plan view.
Figure 6A:
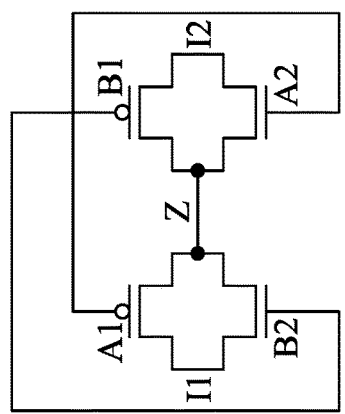
FIG. 6A is a schematic circuit in accordance with some embodiments of the instant disclosure.

Attention is now invited to FIGS. 6A and 6B. FIG. 6A is the circuit structure of the layout shown in FIG. 6B. In FIG. 6B, a pair of dummy poly strips 122 are disposed at opposite ends, and two device poly strips 124 are disposed in between the pair of dummy poly strips 122, along the first direction (Y-direction). The device poly strips 124 are separated by cut line 114, and hence the two device poly strips 124 are cut off into four physically disconnected device poly strips 124. The first metal leads 132, 134 and four second metal leads 164 are disposed in similar pattern as shown in FIG. 2A. There are 10 first interconnect plugs annotated as IP0 to IP9 in FIG. 6B. The first interconnect plugs IP0 to IP9 are formed in Z-direction and electrically connect the poly strips 120 to the first metal leads 130. For the sake of clarity, the second interconnect plugs, which electrically connect the first metal leads 130 (including the first metal leads 132 and 134) to the second metal leads 164, are shown as a square enclosed by thick solid line in the diagram. Places where the first interconnect plugs and second interconnect plugs are overlapped are each shown as a cross mark that is enclosed by a square in thick solid line.

The layout shown in FIG. 6B includes PMOS transistors A1 and B1 and NMOS transistors A2 and B2 corresponding to the same shown in FIG. 6A. For simplicity of illustration, the transistors A1, B1, A2, and B2 are merely labelled at the corresponding device poly strips 124, as shown in FIG. 6B. A routing path from PMOS transistor A1 to NMOS transistor A2 of FIG. 5B starts from the PMOS transistor A1. For illustration, a signal then goes through IP1 in Z-direction to the first metal lead 134, and the signal next goes further up to the second metal lead 164 through a second interconnect plug. Further down the path, the signal goes across the second metal lead 164 and down back to a first metal lead 132 that is disposed over the dummy poly strip 122. The signal then travels in Y-direction down to another second interconnect plug and goes up to another second metal lead 164. Going along the second metal lead 164, the signal is then transmitted halfway through its path. The signal then steps down to first metal lead 134 through a second interconnect plug and first interconnect plug IP4, which overlaps with its corresponding second interconnect plug. The signal then arrives at poly strip 124 where the NMOS transistor A2 is disposed.

A routing path from PMOS transistor B1 to NMOS transistor B2 of FIG. 6B starts from the PMOS transistor B1. For illustration, a signal then goes through IP2 in Z-direction to the first metal lead 134, and the signal next goes further up to the second metal lead 164 through a second interconnect plug, which overlaps with its corresponding first interconnect plug IP2. Further down the path, the signal goes across the second metal lead 164 and down back to a first metal lead 132 that is disposed over the dummy poly strip 122. The signal then travels in Y-direction down to another second interconnect plug to reach second metal lead 164, and goes along a reversed Y-direction on the second metal lead 164. Going along the second metal lead 164, the signal is then travelling in the active region 118. The signal then steps down to first metal lead 134 through a second interconnect plug and first interconnect plug IP3. The signal then arrives at poly strip 124 where the NMOS transistor B2 is disposed.

A routing path from source/drain I1 of the PMOS transistor A1 to source/drain I1 of the NMOS transistor B2 of FIG. 6B starts from the source/drain I1 of PMOS transistor A1. For illustration, a signal goes through IP5 in Z-direction to the first metal lead 134, and the signal next travels all the way down in Y-direction along the first metal lead 134 and reaches first interconnect plug IP8. The signal steps down to the source/drain region 118a where the source/drain I1 of NMOS transistor B2 is located.

A routing path from source/drain I2 of the PMOS transistor B1 to source/drain I2 of the NMOS transistor A2 of FIG. 6B starts from the source/drain I2 of PMOS transistor B1. For illustration, a signal goes through IP7 in Z-direction to the first metal lead 134, and the signal next travels all the way down in Y-direction along the first metal lead 134 and reaches first interconnect plug IP0. The signal steps down to the source/drain region 118a where the source/drain I2 of NMOS transistor A2 is located.

A routing path from connection node Z of the PMOS transistors A1 and B1 to connection node Z of the NMOS transistors A2 and B2 of FIG. 6B starts from the connection node Z of PMOS transistors A1 and B1. For illustration, a signal goes through IP6 in Z-direction to the first metal lead 134, and the signal next travels all the way down in Y-direction along the first metal lead 134 and reaches first interconnect plug IP9. The signal steps down to the source/drain region 118a where the connection node Z is located.

Attention is now invited to FIGS. 7A and 7B. FIG. 7A is the circuit structure of the layout shown in FIG. 7B. In FIG. 7B, a pair of dummy poly strips 122 are disposed at opposite ends, and two device poly strips 124 are disposed in between the pair of dummy poly strips 122, along the first direction (Y-direction). The first metal leads 132, 134 are also arranged in Y-direction. Unlike the layout shown in FIG. 6B, the first metal cell leads 134 are in different pattern. Each one of the first metal cell leads 134 between I1 and I2 is separated as two portions, as shown in FIG. 7B. Four second metal leads 164 are disposed in similar pattern as shown in FIG. 6B. There are 8 interconnect plugs annotated as IP0 to IP7 in FIG. 7B.

A routing path from PMOS transistor A1 to NMOS transistor A2 of FIG. 7B starts from the PMOS transistor A1. For illustration, a signal goes straight down to the NMOS transistor A2 along the poly strip 124 because the poly strip 124 is not cut off by the cut line.

Similarly, a routing path from PMOS transistor B1 to NMOS transistor B2 of FIG. 7B starts from the PMOS transistor B1. For illustration, a signal goes straight down to the NMOS transistor B2 along the poly strip 124.

A routing path from source/drain I1 of the PMOS transistor A1 to source/drain I1 of the NMOS transistor A2 of FIG. 7B starts from the source/drain I1 of PMOS transistor A1. For illustration, a signal goes through IP3 in Z-direction to the first metal lead 134 and straight through to a second interconnect plug, which overlaps with its corresponding first interconnect plug IP3 up to the second metal lead 164. The signal then goes across the second metal lead 164 and down back to first metal lead 132 that is disposed over the dummy poly strip 122. The signal then travels in Y-direction down to another second interconnect plug and goes up to another second metal lead 164. Then the signal travels in X-direction along the second metal lead 164 to another second interconnect plug down to first metal lead 134. The signal then enters the active region 118 to the source/drain region 118a through first interconnect plug IP6 and reaches the source/drain I1 of NMOS transistor A2.

A routing path from source/drain I2 of the PMOS transistor B1 to source/drain I2 of the NMOS transistor A2 of FIG. 7B starts from the source/drain I2 of PMOS transistor B1. For illustration, a signal goes through IP5 in Z-direction to the first metal lead 134 and straight through to a second interconnect plug, which overlaps with its corresponding first interconnect plug IP5 up to the second metal lead 164. The signal then goes across the second metal lead 164 and down back to first metal lead 132 that is disposed over the dummy poly strip 122. The signal then travels in Y-direction down to another second interconnect plug and goes up to another second metal lead 164. Then the signal travels in X-direction along the second metal lead 164 to another second interconnect plug down to first metal lead 134. The signal then enters the active region 118 and goes down to the source/drain region 118a through first interconnect plug IP0, which overlaps with its corresponding second interconnect plug, and reaches the source/drain I2 of NMOS transistor A2.

A routing path from connection node Z of the PMOS transistors A1 and B1 to connection node Z of the NMOS transistors A2 and B2 of FIG. 7B starts from the connection node Z of PMOS transistors A1 and B1. For illustration, a signal goes through IP4 in Z-direction to the first metal lead 134, and the signal next travels all the way down in Y-direction along the first metal lead 134 and reaches first interconnect plug IP7. The signal steps down to the source/drain region 118a where the connection node Z of NMOS transistors A2 and B2 is located.

Figure 8A:
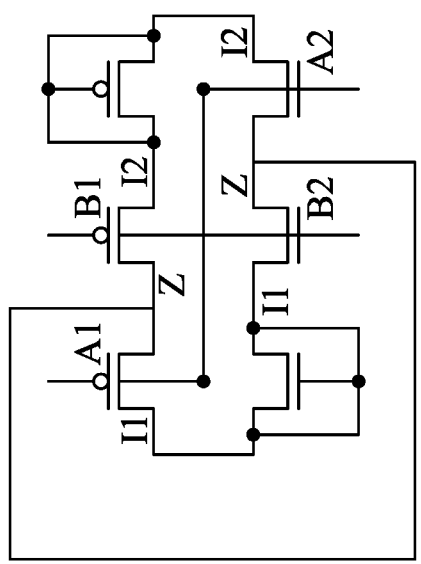
FIG. 8A is a schematic circuit in accordance with some embodiments of the instant disclosure.
Figure 8B:
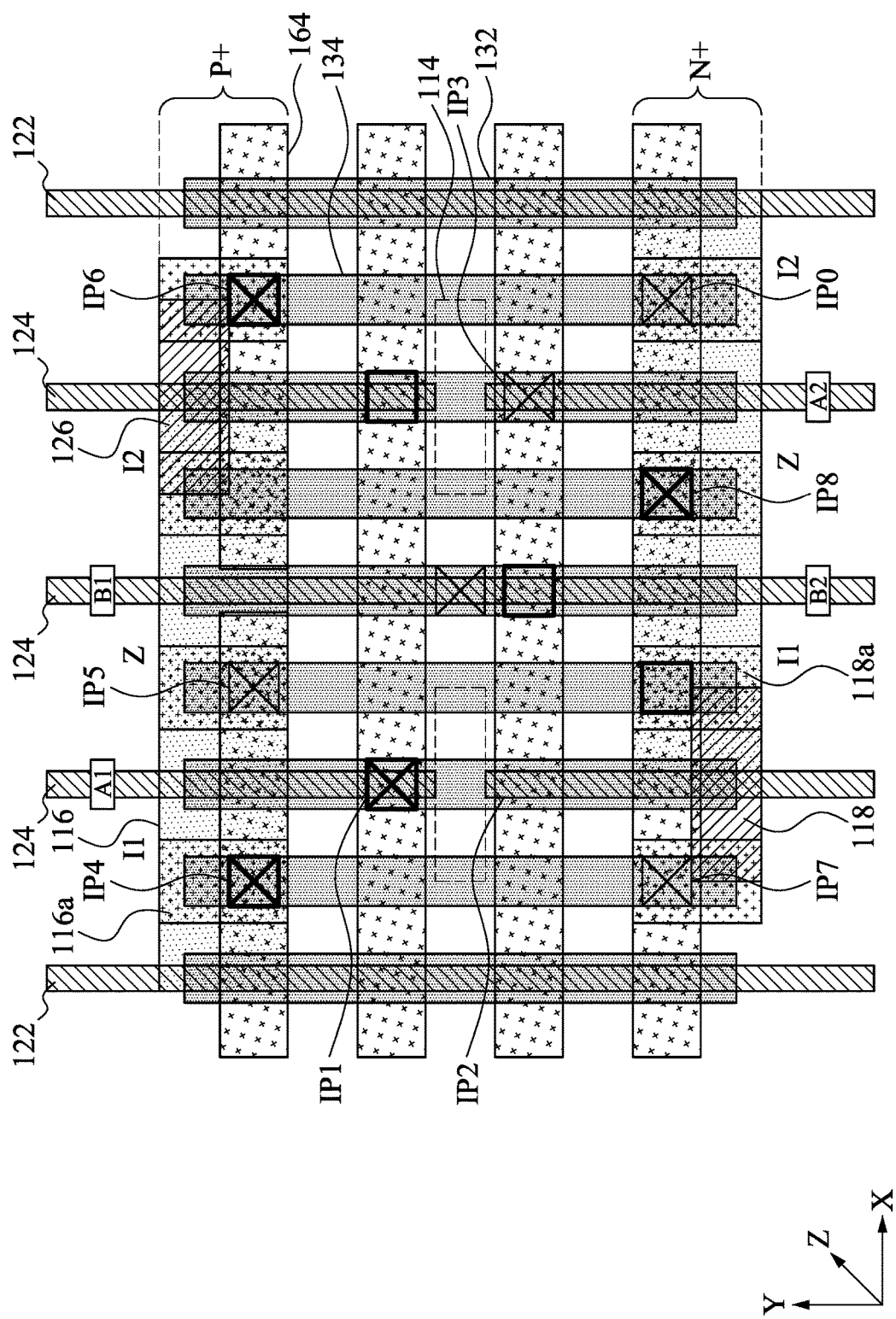
FIG. 8B is a schematic layout of the circuit shown in FIG. 8A in plan view.

Attention is now invited to FIGS. 8A and 8B. FIG. 8A is the circuit structure of the layout shown in FIG. 8B. In FIG. 8B, a pair of dummy poly strips 122 are disposed at opposite ends, and three device poly strips 124 are disposed in between the pair of dummy poly strips 122 along the first direction (Y-direction). Two of the three device poly strips 124 are separated by cut line 114, and hence the two device poly strips 124 are cut off into four physically disconnected device poly strips 124. The first metal leads 132, 134 and four second metal leads 164 are disposed in similar pattern as shown in FIG. 2A. There are 9 first interconnect plugs annotated as IP0 to IP8 in FIG. 8B. In addition, source/drain interconnect blocks 126 are disposed in between two source/drain regions on opposite sides of the device poly strips 124.

A routing path from PMOS transistor A1 to NMOS transistor A2 of FIG. 8B starts from the PMOS transistor A1. For illustration, a signal then goes through IP1 in Z-direction to the first metal lead 134, and the signal next goes further up to the second metal lead 164 through a second interconnect plug. Further down the path, the signal goes across the second metal lead 164 in X-direction and down back to first metal lead 134. The signal then travels in Y-direction down to first interconnect plug IP4 and then arrives at poly strip 124 where the NMOS transistor A2 is disposed.

A routing path from PMOS transistor B1 to NMOS transistor B2 of FIG. 8B starts from the PMOS transistor B1. For illustration, a signal then goes straight to transistor B2 through the poly strip 124.

A routing path from source/drain I1 of the PMOS transistor A1 to source/drain I1 of the NMOS transistor B2 of FIG. 8B starts from the source/drain I1 of PMOS transistor A1. For illustration, a signal goes through IP4 in Z-direction to the first metal lead 134, and the signal next travels all the way down in Y-direction along the first metal lead 134 and reaches first interconnect plug IP7. The signal steps down to the source/drain region 118a and crosses source/drain interconnect block 126 to the neighbouring source/drain region 118a where the source/drain I1 of NMOS transistor B2 is located.

A routing path from source/drain I2 of the PMOS transistor B1 to source/drain I2 of the NMOS transistor A2 of FIG. 8B starts from the source/drain I2 of PMOS transistor B1. For illustration, a signal from source/drain region 116a goes through IP6 in Z-direction to the first metal lead 134, and the signal next travels all the way down in Y-direction along the first metal lead 134 and reaches first interconnect plug IP0. The signal steps down to the source/drain region 118a where the source/drain I2 of NMOS transistor A2 is located.

A routing path from connection node Z of the PMOS transistors A1 and B1 to connection node Z of the NMOS transistors A2 and B2 of FIG. 8B starts from the connection node Z of PMOS transistors A1 and B1. For illustration, a signal from source/drain region 116a goes through IP5 in Z-direction to the first metal lead 134, and the signal next travels all the way down in Y-direction along the first metal lead 134 and goes up to a second interconnect plug to second metal lead 164. The signal then goes in X-direction within the active region 118 and steps down to first metal lead 134 through second interconnect plug and interconnect plug IP8.

The signal then arrives at source/drain region 118a where the connection node Z is located.

Figure 9A:
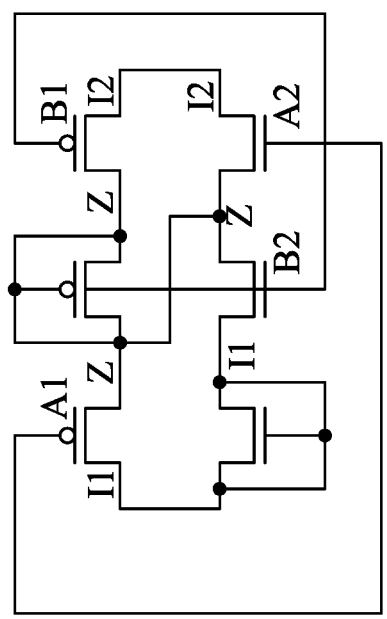
FIG. 9A is a schematic circuit in accordance with some embodiments of the instant disclosure.
Figure 9B:
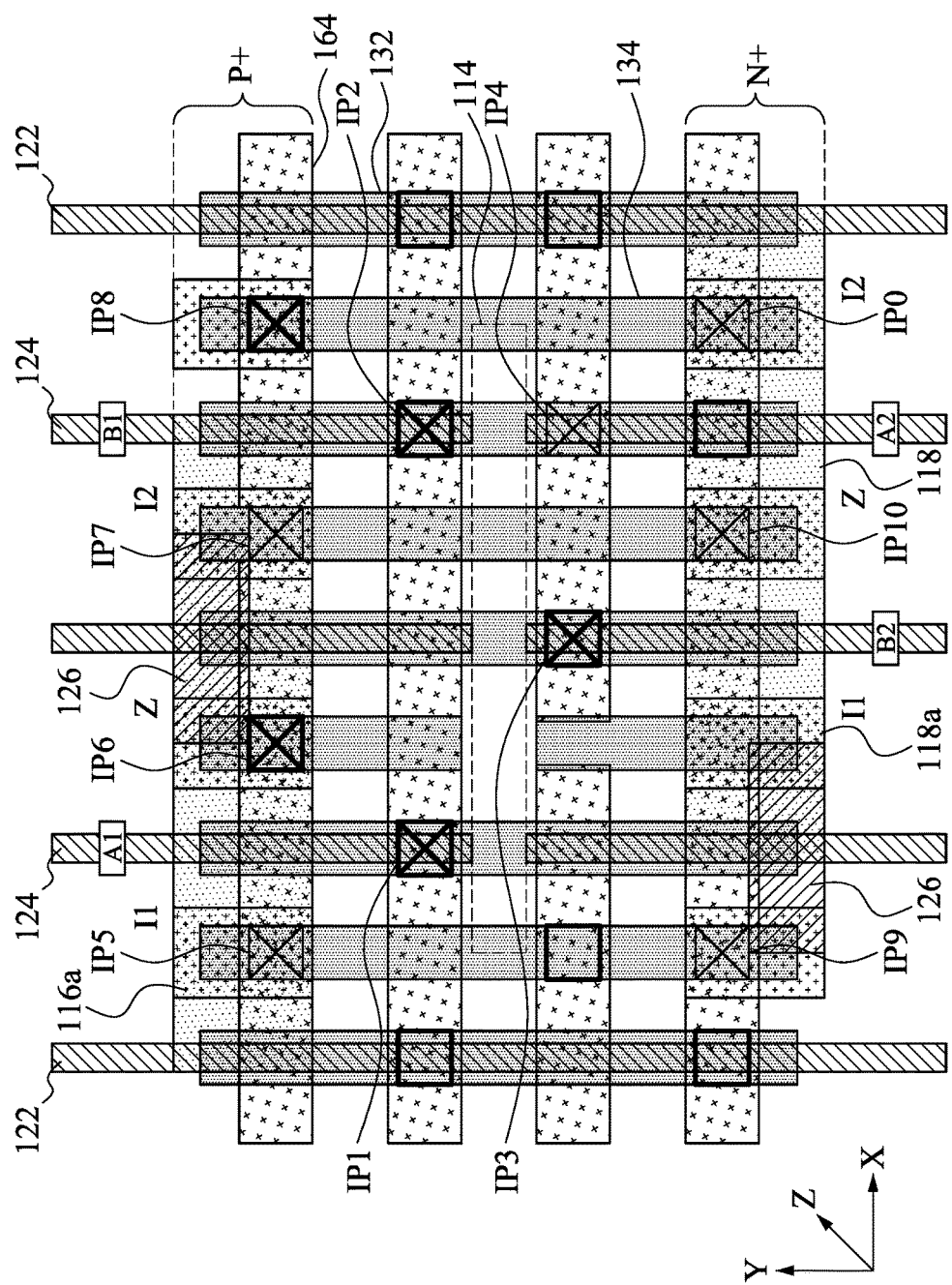
FIG. 9B is a schematic layout of the circuit shown in FIG. 9A in plan view.

Attention is now invited to FIGS. 9A and 9B. FIG. 9A is the circuit structure of the layout shown in FIG. 9B. In FIG. 9B, a pair of dummy poly strips 122 are disposed at opposite ends, and three device poly strips 124 are disposed in between the pair of dummy poly strips 122 along the first direction (Y-direction). The device poly strips 124 are separated by cut line 114, and hence there are six physically disconnected device poly strips 124. The first metal leads 132, 134 and four second metal leads 164 are disposed in similar pattern as shown in FIG. 2A. There are 11 first interconnect plugs annotated as IP0 to IP10 in FIG. 9B. In addition, source/drain interconnect blocks 126 are disposed in between two source/drain regions on opposite sides of the device poly strips 124.

A routing path from PMOS transistor A1 to NMOS transistor A2 of FIG. 9B starts from the PMOS transistor A1. For illustration, a signal then goes through IP1 in Z-direction to the first metal lead 134, and the signal next goes further up to the second metal lead 164 through a second interconnect plug, which overlaps first interconnect plug IP1. Further down the path, the signal goes across the second metal lead 164 and down back to a first metal lead 132 that is disposed over the dummy poly strip 122. The signal then travels in Y-direction down to another second interconnect plug and goes up to another second metal lead 164. Going along the second metal lead 164 in X-direction in the active region 118, the signal then steps down to first metal lead 134 through a second interconnect plug. Further up the path, the first interconnect plug IP4 is met, and the signal then arrives at poly strip 124 where the NMOS transistor A2 is disposed.

A routing path from PMOS transistor B1 to NMOS transistor B2 of FIG. 9B starts from the PMOS transistor B1. For illustration, a signal then goes through IP2 in Z-direction to the first metal lead 134, and the signal next goes further up to the second metal lead 164 through a second interconnect plug, which overlaps with its corresponding first interconnect plug IP2. Further down the path, the signal goes across the second metal lead 164 and down back to a first metal lead 132 that is disposed over the dummy poly strip 122. The signal then travels in Y-direction down to another second interconnect plug to reach another second metal lead 164. Going along the second metal lead 164, the signal then steps down to first metal lead 134 through a second interconnect plug and first interconnect plug IP3, which overlaps with its corresponding second interconnect plug. The signal then arrives at poly strip 124 where the NMOS transistor B2 is disposed.

A routing path from source/drain I1 of the PMOS transistor A1 to source/drain I1 of the NMOS transistor B2 of FIG. 9B starts from the source/drain I1 of PMOS transistor A1. For illustration, a signal from source/drain region 116a goes through IP5 in Z-direction to the first metal lead 134, and the signal next travels all the way down in Y-direction along the first metal lead 134 and reaches first interconnect plug IP9. The signal steps down to the source/drain region 118a and crosses source/drain interconnect block 126 to the neighbouring source/drain region 118a where the source/drain I1 of NMOS transistor B2 is located.

A routing path from source/drain I2 of the PMOS transistor B1 to source/drain I2 of the NMOS transistor A2 of FIG. 9B starts from the source/drain I2 of PMOS transistor B1. For illustration, a signal from source/drain region 116a goes through IP8 in Z-direction to the first metal lead 134, and the signal next travels all the way down in Y-direction along the first metal lead 134 and reaches first interconnect plug IP0. The signal steps down to the source/drain region 118*a* where the source/drain I2 of NMOS transistor A2 is located.

A routing path from connection node Z of the PMOS transistors A1 and B1 to connection node Z of the NMOS transistors A2 and B2 of FIG. 9B starts from the connection node Z of PMOS transistors A1 and B1. For illustration, a signal goes through IP6 in Z-direction to the first metal lead 134, and the signal next crosses poly strip 124 through source/drain interconnect block 126 to first interconnect plug IP7. The signal steps down to the source/drain region 118*a* where the connection node Z of NMOS transistors A2 and B2 is located.

Figure 10A:
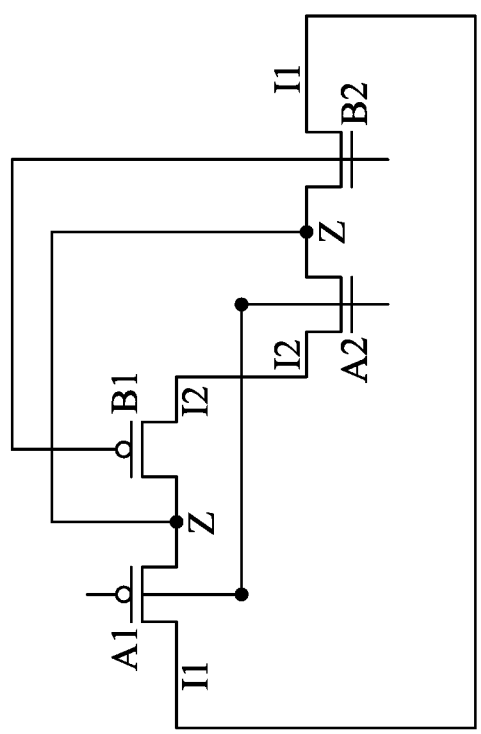
FIG. 10A is a schematic circuit in accordance with some embodiments of the instant disclosure.
Figure 10B:
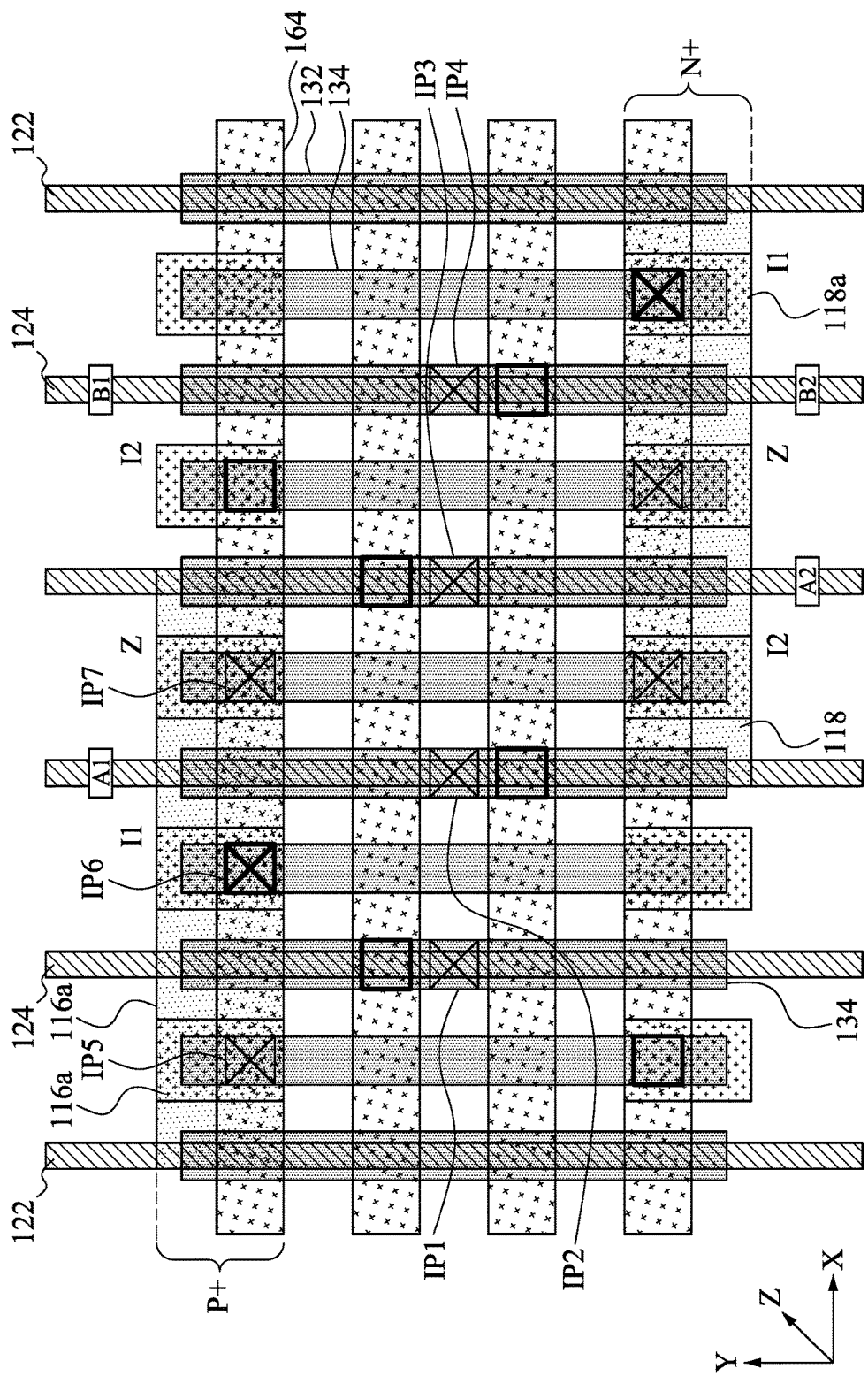
FIG. 10B is a schematic layout of the circuit shown in FIG. 10A in plan view.

Attention is now invited to FIGS. 10A and 10B. FIG. 10A is the circuit structure of the layout shown in FIG. 10B. In FIG. 10B, a pair of dummy poly strips 122 are disposed at opposite ends, and four device poly strips 124 are disposed in between the pair of dummy poly strips 122 along the first direction (Y-direction). The first metal leads 132, 134 and four second metal leads 164 are disposed in similar pattern as shown in FIG. 2A. There are 10 first interconnect plugs annotated as IP0 to IP9 in FIG. 10B.

A routing path from PMOS transistor A1 to NMOS transistor A2 of FIG. 10B starts from the PMOS transistor A1. For illustration, a signal then goes through IP1 in Z-direction to the first metal lead 134, and the signal next goes further up to the second metal lead 164 through a second interconnect plug. Further down the path, the signal goes across the second metal lead 164 in X-direction and down back to first metal lead 134. The signal then travels in Y-direction down to first interconnect plug IP4 and then arrives at poly strip 124 where the NMOS transistor A2 is disposed.

A routing path from PMOS transistor B1 to NMOS transistor B2 of FIG. 10B starts from the PMOS transistor B1. For illustration, a signal then goes through IP2 in Z-direction to the first metal lead 134, and the signal next goes further up to the second metal lead 164 through a second interconnect plug. Further down the path, the signal goes across the second metal lead 164 in X-direction and down back to first metal lead 134 through another second interconnect plug. The signal then travels in Y-direction down to first interconnect plug IP3 and then arrives at poly strip 124 where the NMOS transistor B2 is disposed.

A routing path from source/drain I1 of the PMOS transistor A1 to source/drain I1 of the NMOS transistor B2 of FIG. 10B starts from the source/drain I1 of PMOS transistor A1. For illustration, a signal then goes through IP5 in Z-direction to the first metal lead 134. Next the signal travels down in Y-direction along the first metal lead 134 and reach second interconnect plug up to second metal lead 164. The signal then goes across the second metal lead 164 in X-direction and down first metal lead 134 through another second interconnect plug. The signal enters the active region 118 and goes down to the source/drain region 118*a* through first interconnect plug IP8, which overlaps with its corresponding second interconnect plug, and reaches the source/drain I1 on source/drain region 118*a* of NMOS transistor B2.

A routing path from source/drain I2 of the PMOS transistor B1 to source/drain I2 of the NMOS transistor A2 of FIG. 10B starts from the source/drain I2 of PMOS transistor B1. For illustration, a signal from source/drain region 116*a* goes through IP8 in Z-direction to the first metal lead 134, and the signal next travels all the way down in Y-direction along the first metal lead 134 and reaches first interconnect plug IP0. The signal steps down to the source/drain region 118*a* where the source/drain I2 of NMOS transistor A2 is located.

A routing path from connection node Z of the PMOS transistors A1 and B1 to connection node Z of the NMOS transistors A2 and B2 of FIG. 10B starts from the connection node Z of PMOS transistors A1 and B1. A signal from source/drain region 116*a* goes through IP6 in Z-direction to the first metal lead 134 and straight up to second metal lead 164 through second interconnect plug, which overlaps the first interconnect plug IP6. The signal next travels in X-direction along the second metal lead 164 and goes down to second interconnect plug to first metal lead 134. The signal then goes in Y-direction and steps first interconnect plug IP9 and arrives at source/drain region 118*a* where the connection node Z is located.

Figures 11A, 11B:
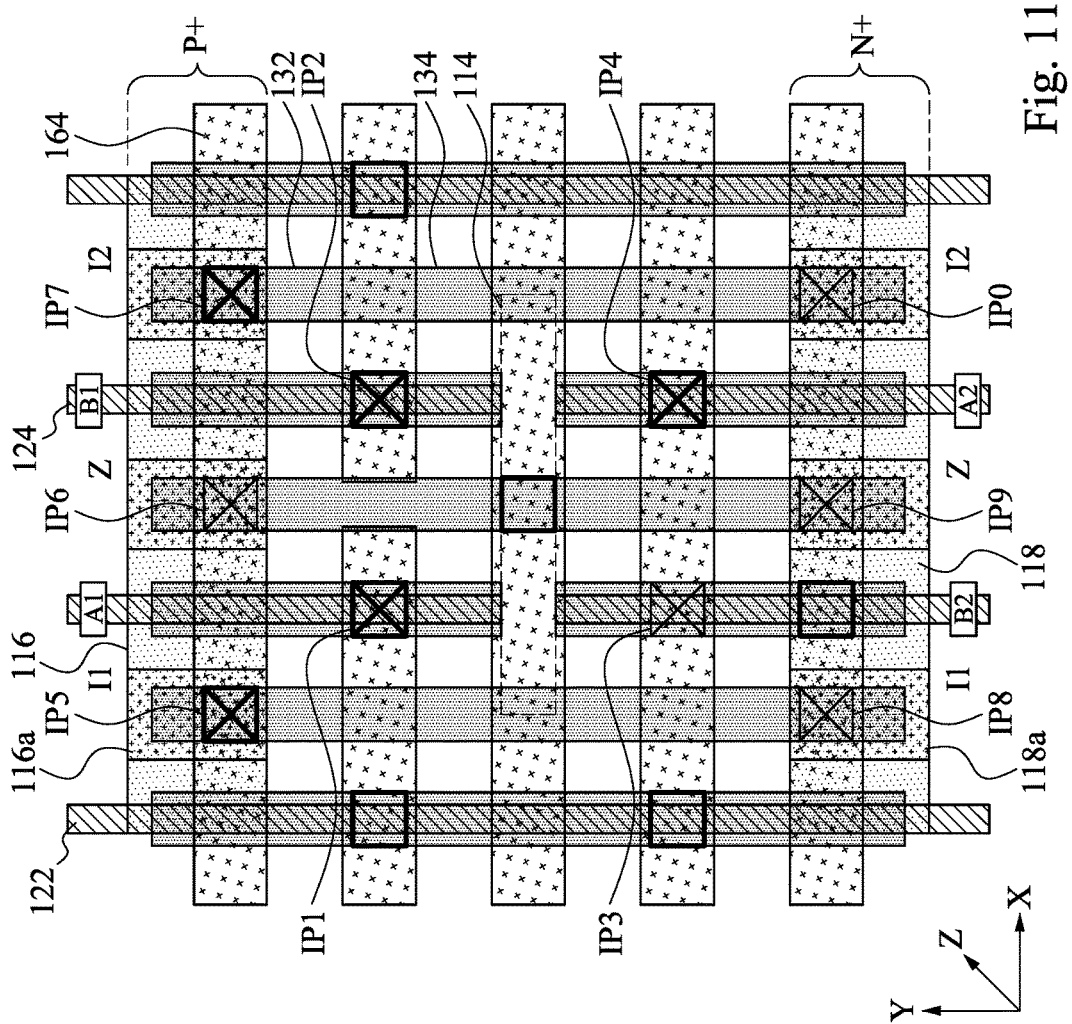
FIG. 11A is a schematic circuit in accordance with some embodiments of the instant disclosure.
FIG. 11B is a schematic layout of the circuit shown in FIG. 11A in plan view.

Attention is now invited to FIGS. 11A and 11B. FIG. 11A is the circuit structure of the layout shown in FIG. 11B. In FIG. 11B, a pair of dummy poly strips 122 are disposed at opposite ends, and two device poly strips 124 are disposed in between the pair of dummy poly strips 122 along the first direction (Y-direction). Two device poly strips 124 are separated by cut line 114, and hence the two device poly strips 124 are cut off into four physically disconnected active device poly strips 124. The first metal leads 132, 134 have three columns, and second metal leads 164 have five rows. The first and second metal leads are disposed in similar pattern as shown in FIG. 2A. There are 10 first interconnect plugs annotated as IP0 to IP9 in FIG. 11B. The first interconnect plugs IP0 to IP9 are electrically connected between the poly strips 120 and the first metal leads 130, in Z-direction.

A routing path from PMOS transistor A1 to NMOS transistor A2 of FIG. 11B starts from the PMOS transistor A1. For illustration, a signal then goes through IP1 in Z-direction to the first metal lead 134, and the signal next goes further up to the second metal lead 164 through a second interconnect plug. Further down the path, the signal goes across the second metal lead 164 and down back to a first metal lead 132 that is disposed over the dummy poly strip 122. The signal then travels in Y-direction down to another second interconnect plug and goes up to another second metal lead 164. Going along the second metal lead 164, the signal is then transmitted halfway through its path. The signal then steps down to first metal lead 134 through a second interconnect plug and first interconnect plug IP4, which overlaps with its corresponding second interconnect plug. The signal then arrives at poly strip 124 where the NMOS transistor A2 is disposed.

A routing path from PMOS transistor B1 to NMOS transistor B2 of FIG. 11B starts from the PMOS transistor B1. For illustration, a signal then goes through IP2 in Z-direction to the first metal lead 134, and the signal next goes further up to the second metal lead 164 through a second interconnect plug, which overlaps with its corresponding first interconnect plug IP2. Further down the path, the signal goes across the second metal lead 164 and down back to a first metal lead 132 that is disposed over the dummy poly strip 122. The signal then travels in Y-direction down to another second interconnect plug to reach second metal lead 164, and goes along a reversed Y-direction on the second metal lead 164. Going along the second metal lead 164, the signal is then travelling in the active region 118. The signal then steps down to first metal lead 134 through a second interconnect plug and first interconnect plug IP3. The signal then arrives at poly strip 124 where the NMOS transistor B2 is disposed.

A routing path from source/drain I1 of the PMOS transistor A1 to source/drain I1 of the NMOS transistor B2 of FIG. 11B starts from the source/drain I1 of PMOS transistor A1. For illustration, a signal from source/drain region 116a goes through IP5 in Z-direction to the first metal lead 134, and the signal next travels all the way down in Y-direction along the first metal lead 134 and reaches first interconnect plug IP8. The signal steps down to the source/drain region 118a where the source/drain I1 of NMOS transistor B2 is located.

A routing path from source/drain I2 of the PMOS transistor B1 to source/drain I2 of the NMOS transistor A2 of FIG. 11B starts from the source/drain I2 of PMOS transistor B1. For illustration, a signal from source/drain region 116a goes through IP7 in Z-direction to the first metal lead 134, and the signal next travels all the way down in Y-direction along the first metal lead 134 and reaches first interconnect plug IP0. The signal steps down to the source/drain region 118a where the source/drain I2 of NMOS transistor A2 is located.

A routing path from connection node Z of the PMOS transistors A1 and B1 to connection node Z of the NMOS transistors A2 and B2 of FIG. 11B starts from the connection node Z at source/drain region 116a of PMOS transistor A1. For illustration, a signal goes through IP6 in Z-direction to the first metal lead 134, and the signal next travels all the way down in Y-direction along the first metal lead 134 and reaches first interconnect plug IP9. The signal steps down to the source/drain region 118a where the connection node Z is located.

Figure 12A:
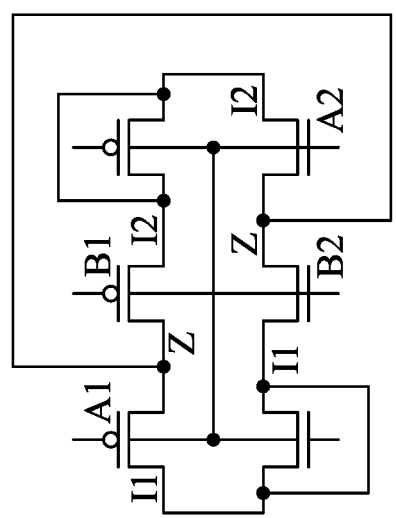
FIG. 12A is a schematic circuit in accordance with some embodiments of the instant disclosure.
Figure 12B:
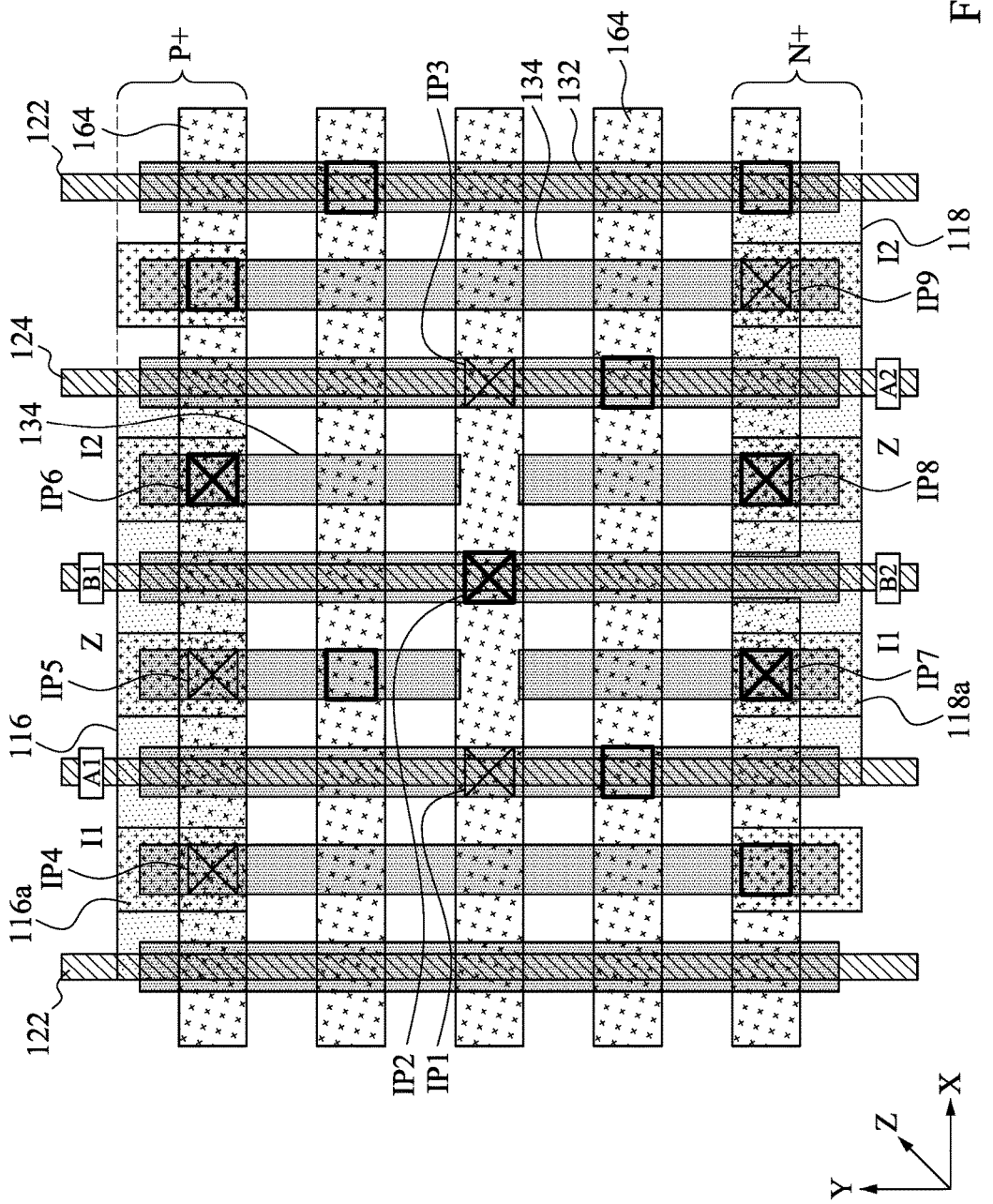
FIG. 12B is a schematic layout of the circuit shown in FIG. 12A in plan view.

Attention is now invited to FIGS. 12A and 12B. FIG. 12A is the circuit structure of the layout shown in FIG. 12B. In FIG. 12B, a pair of dummy poly strips 122 are disposed at opposite ends, and three device poly strips 124 are disposed in between the pair of dummy poly strips 122 along the first direction (Y-direction). The first metal leads 132, 134 have 9 columns, and second metal leads 164 have 5 rows, as shown in FIG. 12B. The first and second metal leads 130, 160 are disposed in similar pattern as shown in FIG. 2A. There are 9 first interconnect plugs annotated as IP0 to IP8 in FIG. 12B.

A routing path from PMOS transistor A1 to NMOS transistor A2 of FIG. 12B starts from the PMOS transistor A1. For illustration, a signal then goes through IP1 in Z-direction to the first metal lead 134, and the signal next goes further up to the second metal lead 164 through a second interconnect plug. Further down the path, the signal goes across the second metal lead 164 in X-direction and back to first metal lead 134 through another second interconnect plug. The signal then travels in Y-direction to first interconnect plug IP4 and then arrives at poly strip 124 where the NMOS transistor A2 is disposed.

A routing path from PMOS transistor B1 to NMOS transistor B2 of FIG. 12B starts from the PMOS transistor B1. A signal then goes straight to NMOS transistor B2 through the poly strip 124.

A routing path from source/drain I1 of the PMOS transistor A1 to source/drain I1 of the NMOS transistor B2 of FIG. 12B starts from the source/drain I1 of PMOS transistor A1. For illustration, a signal goes through IP4 in Z-direction to the first metal lead 134, and the signal next travels all the way down in Y-direction along the first metal lead 134 and reaches second interconnect plug to second metal lead 164. The signal the goes in Y-direction and steps down to another second interconnect plug and further down to first interconnect plug IP7 to first meta layer lead 134. Next, the signal arrives at the source/drain region 118a where the source/drain I1 of NMOS transistor B2 is located.

A routing path from source/drain I2 of the PMOS transistor B1 to source/drain I2 of the NMOS transistor A2 of FIG. 12B starts from the source/drain I2 of PMOS transistor B1. A signal goes through IP6 in Z-direction to the first metal lead 134 and straight up to second metal layer 164 through second interconnect plug. The signal next travels in X-direction until another second interconnect plug is met and steps down to first metal lead 134. The signal then goes all the way down in Y-direction along the first metal lead 134 and reaches first interconnect plug IP0 to the source/drain region 118a where the source/drain I2 of NMOS transistor A2 is located.

A routing path from connection node Z of the PMOS transistors A1 and B1 to connection node Z of the NMOS transistors A2 and B2 of FIG. 12B starts from the connection node Z of PMOS transistors A1 and B1. For illustration, a signal from source/drain region 116a goes through IP5 in Z-direction to the first metal lead 134, and the signal next travels down in Y-direction along the first metal lead 134 and goes up to a second interconnect plug to second metal lead 164. The signal then goes in X-direction and steps down to first metal lead 132, which overlaps dummy poly strip 122, through second interconnect plug. The signal then goes in Y-direction to reach another second interconnect plug to reach second metal layer 164. The signal then travels in active region 118 in X-direction and goes down second interconnect plug and further down first interconnect plug IP8 to arrive at source/drain region 118a where the connection node Z is located.

Figure 13A:
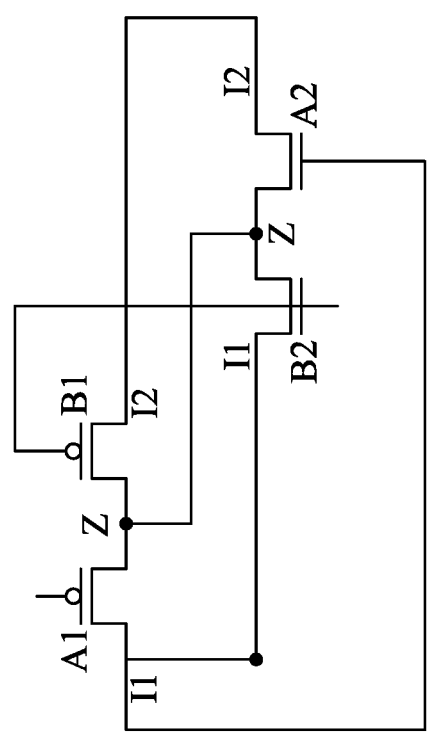
FIG. 13A is a schematic circuit in accordance with some embodiments of the instant disclosure.
Figure 13B:
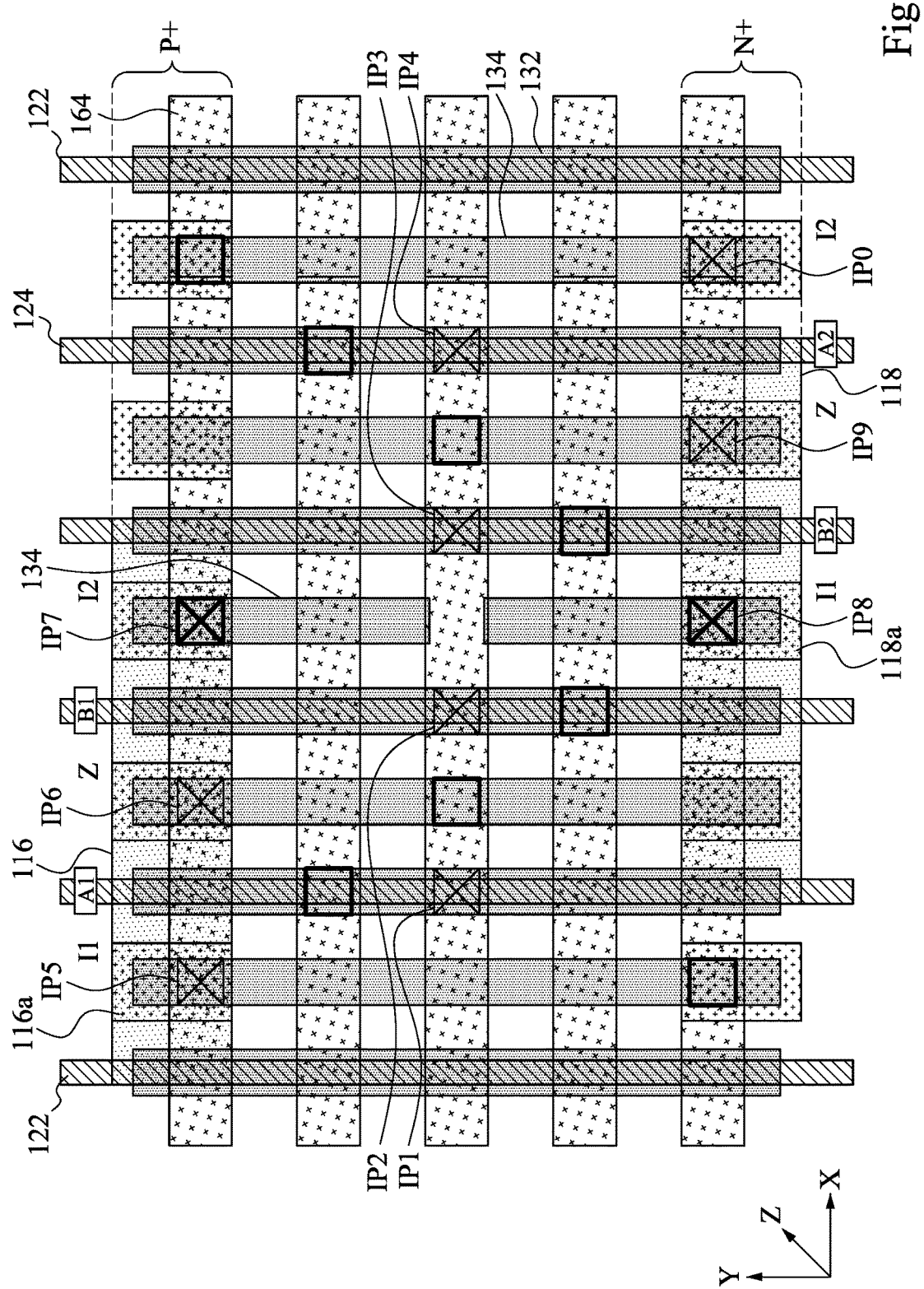
FIG. 13B is a schematic layout of the circuit shown in FIG. 13A in plan view.

Attention is now invited to FIGS. 13A and 13B. FIG. 13A is the circuit structure of the layout shown in FIG. 13B. In FIG. 13B, a pair of dummy poly strips 122 are disposed at opposite ends, and four device poly strips 124 are disposed in between the pair of dummy poly strips 122 along the first direction (Y-direction). For illustration in FIG. 13B, eleven columns of first metal leads 132, 134 and five rows of second metal leads 164 are disposed in similar pattern as shown in FIG. 2A. There are 10 first interconnect plugs annotated as IP0 to IP9 in FIG. 13B.

A routing path from PMOS transistor A1 to NMOS transistor A2 of FIG. 13B starts from the PMOS transistor A1 of device. A signal then goes through IP1 in Z-direction to the first metal lead 134, and the signal next goes further up to the second metal lead 164 through a second interconnect plug. Further down the path, the signal goes across the second metal lead 164 in X-direction and down back to first metal lead 134 through another second interconnect plug. The signal then travels in Y-direction down to first interconnect plug IP4 to poly strip 124. Further down the Y-direction, the signal arrives where the NMOS transistor A2 is disposed.

A routing path from PMOS transistor B1 to NMOS transistor B2 of FIG. 13B starts from the PMOS transistor B1 of device. For illustration, a signal then goes through IP2 in Z-direction to the first metal lead 134, and the signal next goes further up to the second metal lead 164 through a second interconnect plug. Further down the path, the signal goes across the second metal lead 164 in X-direction and down back to first metal lead 134 through another second interconnect plug. The signal then travels in Y-direction to first interconnect plug IP3 and then arrives at active poly strip 124. Further down in Y-direction, the signal arrives at the NMOS transistor B2.

A routing path from source/drain I1 of the PMOS transistor A1 to source/drain I1 of the NMOS transistor B2 of FIG. 13B starts from the source/drain I1 of PMOS transistor A1. For illustration, a signal then goes through IP5 in Z-direction to the first metal lead 134. Next the signal travels down in Y-direction along the first metal lead 134 and reach second interconnect plug up to second metal lead 164. The signal then goes across the second metal lead 164 in X-direction and down first metal lead 134 through another second interconnect plug. The signal enters the active region 118 and goes down to the source/drain region 118a through first interconnect plug IP8, which overlaps with its corresponding second interconnect plug, and reaches the source/drain I1 on source/drain region 118a of NMOS transistor B2.

A routing path from source/drain I2 of the PMOS transistor B1 to source/drain I2 of the NMOS transistor A2 of FIG. 13B starts from the source/drain I2 of PMOS transistor B1. For illustration, a signal from source/drain region 116a goes through IP7 in Z-direction to the first metal lead 134, and the signal next goes straight to an overlapping second interconnect to reach second metal lead 164. The signal travels all the way down in X-direction along the second metal lead 164 and reaches another second interconnect plug down to first metal 134. Then further down the Y-direction along first metal lead 134, the signal reaches first interconnect plug IP0. The signal steps down to the source/drain region 118a where the source/drain I2 of NMOS transistor A2 is located.

A routing path from connection node Z of the PMOS transistors A1 and B1 to connection node Z of the NMOS transistors A2 and B2 of FIG. 13B starts from the connection node Z of PMOS transistors A1 and B1. For illustration, a signal from source/drain region 116a goes through IP6 in Z-direction to the first metal lead 134. Then, going along the first metal lead 134 down in Y-direction to second interconnect plug. Through the second interconnect plug to second metal lead 164. Along the second metal lead 164 in X-direction, the signal then steps down to first metal lead 134 again and goes along Y-direction to reach first interconnect plug IP9 and arrives at source/drain region 118a where the connection node Z is located.

Figure 14A:
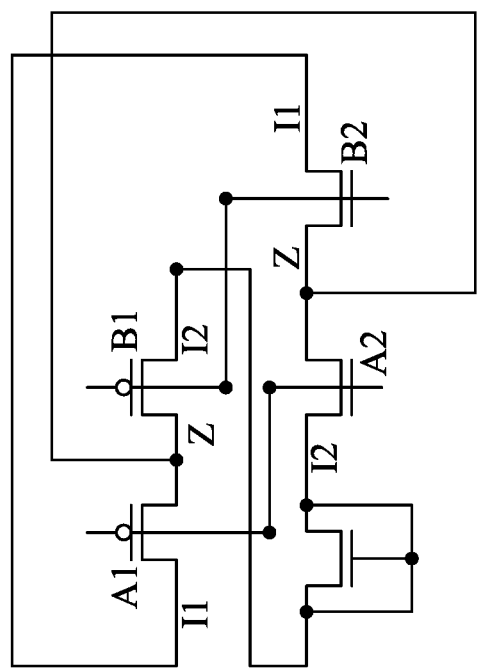
FIG. 14A is a schematic circuit in accordance with some embodiments of the instant disclosure.
Figure 14B:
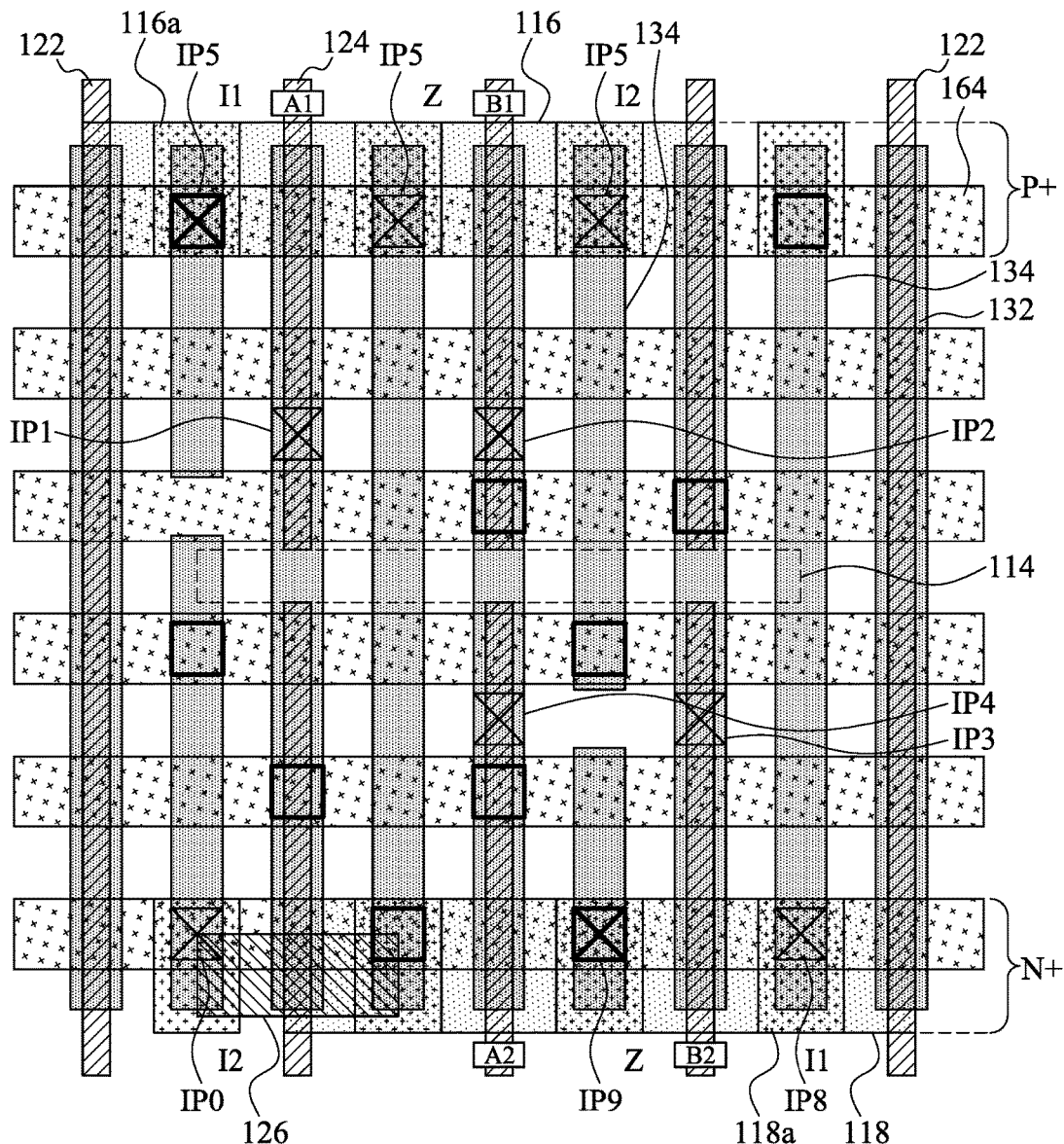
FIG. 14B is a schematic layout of the circuit shown in FIG. 14A in plan view.

Attention is now invited to FIGS. 14A and 14B. FIG. 14A is the circuit structure of the layout shown in FIG. 14. In FIG. 14B, a pair of dummy poly strips 122 are disposed at opposite ends, and three device poly strips 124 are disposed in between the pair of dummy poly strips 122 along the first direction (Y-direction). The three device poly strips 124 are separated by cut line 114, and hence the three active device poly strips 124 are cut off into six physically disconnected active device poly strips 124. For illustration in FIG. 14B, the first metal leads 132, 134 and five rows of second metal leads 164 are disposed in similar pattern as shown in FIG. 2A. There are 10 first interconnect plugs annotated as IP0 to IP9 in FIG. 14B. Source/drain region block 126 is disposed at active region 118.

A routing path from PMOS transistor A1 to NMOS transistor A2 of FIG. 14B starts from the PMOS transistor A1. For illustration, a signal then goes through IP1 in Z-direction to the first metal lead 134, and the signal next goes further up to the second metal lead 164 through a second interconnect plug. Further down the path, the signal goes across the second metal lead 164 in X-direction and down back to first metal lead 134 through another second interconnect. The signal then travels in Y-direction to first interconnect plug IP4 and then arrives at poly strip 124 where the NMOS transistor A2 is disposed.

A routing path from PMOS transistor B1 to NMOS transistor B2 of FIG. 14B starts from the PMOS transistor B1. For illustration, a signal then goes through IP2 in Z-direction to the first metal lead 134, and the signal next goes further up to the second metal lead 164 through a second interconnect plug. Further down the path, the signal goes across the second metal lead 164 in X-direction and down back to first metal lead 134 through another second interconnect plug. The signal then travels in Y-direction down to first interconnect plug IP3 and then arrives at poly strip 124 where the NMOS transistor B2 is disposed.

A routing path from source/drain I1 of the PMOS transistor A1 to source/drain I1 of the NMOS transistor B2 of FIG. 14B starts from the source/drain I1 of PMOS transistor A1. For illustration, a signal then goes through IP5 in Z-direction to the first metal lead 134. Next the signal travels down in Y-direction along the first metal lead 134 and reach second interconnect plug up to second metal lead 164. The signal then goes across the second metal lead 164 in X-direction and down first metal lead 134 through another second interconnect plug. The signal enters the active region 118 and goes down to the source/drain region 118a through first interconnect plug IP8, which overlaps with its corresponding second interconnect plug, and reaches the source/drain I1 on source/drain region 118a of NMOS transistor B2.

A routing path from source/drain I2 of the PMOS transistor B1 to source/drain I2 of the NMOS transistor A2 of FIG. 14B starts from the source/drain I2 of PMOS transistor B1. For illustration, a signal goes through IP7 in Z-direction to the first metal lead 134 and reach second interconnect plug to reach second metal layer 164. The signal next travels in X-direction along the second metal layer 164 until another second interconnect plug is met and steps down to first metal lead 134. The signal then goes all the way down in Y-direction along the first metal lead 134 and reaches first interconnect plug IP0 to the source/drain region 118a where the source/drain I2 of NMOS transistor A2 is located.

A routing path from connection node Z of the PMOS transistors A1 and B1 to connection node Z of the NMOS transistors A2 and B2 of FIG. 14B starts from the connection node Z of PMOS transistors A1 and B1. For illustration, a signal from source/drain region 116a goes through IP6 in Z-direction to the first metal lead 134. Then, going along the first metal lead 134 down in Y-direction to second interconnect plug. Through the second interconnect plug to second metal lead 164. Along the second metal lead 164 in X-direction, the signal then steps down to first metal lead 134 again and goes along Y-direction to reach first interconnect plug IP9 and arrives at source/drain region 118a where the connection node Z is located.

It should be understood that the abovementioned routing path is for exemplary purpose, and alternation may apply according to different layout design.

In some embodiments of the instant disclosure a semiconductor device is provided. The semiconductor device includes semiconductor device includes an active region having a source/drain region and a plurality of poly strips spaced apart and arranged along a first direction crossing over the active region. The first direction is substantially perpendicular to a lengthwise direction of the active region. A first metal pattern is disposed on the poly strips and arranged along the first direction. A plurality of first interconnect plugs is interposed in between the poly strips and the first metal pattern and in between the active region and the first metal pattern. A position of the first interconnect plugs is variable along the first direction.

In some embodiments of the instant disclosure a semiconductor device is provided. The semiconductor device includes a plurality of poly strips spaced apart and extending along a first direction crossing over an active region including source/drain regions. A plurality of first interconnect plugs is disposed on the poly strips and over the source/drain regions. A position of the first interconnect plugs is variable along the first direction. A plurality of first metal leads is arranged over the first interconnect plugs and the source/drain regions and extending along the first direction. A plurality of second metal leads is arranged over the first metal leads and extending along a second direction. The first direction and the second direction are substantially perpendicular. A plurality of second interconnect plugs is interposed in between the first metal leads and the second metal leads.

In some embodiments of the instant disclosure, a method of manufacturing a semiconductor device is provided. The method includes forming a substrate including source/drain regions. A plurality of poly strips is spaced apart from one another and crossing the source/drain regions in a first direction. Subsequently, a plurality of first interconnect plugs are formed over the source/drain regions and the poly strips. A first metal pattern is formed over the first interconnect plugs. The first metal pattern includes a plurality of first metal leads arranged in the first direction. A plurality of second interconnect plugs is formed over the first metal pattern. Next a second metal pattern is formed over the second interconnect plugs. The second metal pattern including a plurality of second metal leads arranged in a second direction substantially perpendicular to the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
an active region comprising a source/drain region;
a plurality of gates spaced apart and arranged along a first direction which is substantially perpendicular to a lengthwise direction of the active region;
a first metal pattern disposed on the gates and comprising a plurality of first metal leads arranged along the first direction, wherein a pitch of two immediately adjacent gates is substantially double a first metal pitch of two immediately adjacent first metal leads; and
a plurality of first interconnect plugs interposed in between the gates and the first metal pattern and in between the active region and the first metal pattern.

2. The semiconductor device of claim 1, wherein the plurality of gates comprise a pair of dummy gates that are arranged along the first direction and that define a device cell boundary.

3. The semiconductor device of claim 2, further comprising:
a second metal pattern disposed on the first metal pattern along a second direction that is substantially perpendicular to the first direction; and
a plurality of second interconnect plugs interposed in between the first metal pattern and the second metal pattern.

4. The semiconductor device of claim 3, wherein the second metal pattern comprises a pair of power straps and a plurality of second metal leads, and the second metal leads are spaced apart and arranged in between the pair of the power straps.

5. The semiconductor device of claim 4, wherein the plurality of second interconnect plugs comprise a plurality of second interconnect border plugs interposed in between the dummy gates and the pair of the power straps.

6. The semiconductor device of claim 2, wherein the plurality of first interconnect plugs comprise a plurality of first interconnect border plugs disposed in between the dummy gates and the first metal pattern.

7. The semiconductor device of claim 3, wherein the first interconnect plugs are offset along the second direction.

8. The semiconductor device of claim 1, wherein the first metal leads overlap the gates.

9. The semiconductor device of claim 1, further comprising a plurality of poly strips formed as the gates.

10. The semiconductor device of claim 1, further comprising a circuit including a plurality of transistors connected to each other.

11. A semiconductor device comprising:
a plurality of gates spaced apart and extending along a first direction crossing over an active region comprising source/drain regions;
a plurality of first interconnect plugs disposed on the gates and over the source/drain regions;
a plurality of first metal leads arranged over the first interconnect plugs and the source/drain regions and extending along the first direction, wherein a pitch of two immediately adjacent gates is substantially double a first metal pitch of two immediately adjacent first metal leads;
a plurality of second metal leads arranged over the first metal leads and extending along a second direction, the first direction and the second direction being substantially perpendicular; and
a plurality of second interconnect plugs interposed in between the first metal leads and the second metal leads.

12. The semiconductor device of claim 11, wherein the gates overlap the first metal leads.

13. The semiconductor device of claim 11, wherein the plurality of gates compriscs comprise at least a pair of dummy gates defining a device cell boundary.

14. The semiconductor device of claim 11, wherein the active region comprises a first active region in a semiconductor substrate and a second active region in the semiconductor substrate and having an opposite conductivity type of the first active region, and the gates, the first active region, and the second active region form at least two first MOS devices and at least two second MOS devices.

15. The semiconductor device of claim 14, wherein one of the first MOS devices is coupled to one of the second MOS devices through one of the first interconnect plugs, one of the first metal leads, one of the second interconnect plugs, and one of the second metal leads.

16. The semiconductor device of claim 11, further comprising a plurality of poly strips formed as the gates.

17. The semiconductor device of claim 11, further comprising a circuit including a plurality of transistors connected to each other.

18. A method of manufacturing a semiconductor device, the method comprising:
forming a substrate including source/drain regions;

forming a plurality of gates spaced apart from one another and crossing the source/drain regions in a first direction;

forming a plurality of first interconnect plugs over the source/drain regions and the gates;

forming a first metal pattern over the first interconnect plugs, the first metal pattern including a plurality of first metal leads arranged in the first direction, wherein forming the first metal pattern is such that a pitch of two immediately adjacent gates is substantially double a first metal pitch of two immediately adjacent first metal leads;

forming a plurality of second interconnect plugs over the first metal pattern; and forming a second metal pattern over the second interconnect plugs, the second metal pattern including a plurality of second metal leads arranged in a second direction substantially perpendicular to the first direction.

19. The method of claim 18, wherein the gates overlap the first metal leads.

20. The method of claim 18, further comprising forming a circuit including a plurality of transistors connected to each other.

* * * * *